United States Patent
Hasegawa et al.

(10) Patent No.: US 7,310,207 B2
(45) Date of Patent: Dec. 18, 2007

(54) MAGNETIC SENSING ELEMENT INCLUDING MAGNETIC LAYER COMPOSED OF HEUSLER ALLOY DISPOSED ON UNDERLAYER HAVING {111}-ORIENTED FCC STRUCTURE

(75) Inventors: Naoya Hasegawa, Niigata-ken (JP); Masamichi Saito, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 343 days.

(21) Appl. No.: 10/953,930

(22) Filed: Sep. 29, 2004

(65) Prior Publication Data

US 2005/0073778 A1    Apr. 7, 2005

(30) Foreign Application Priority Data

Oct. 6, 2003    (JP)    ............... 2003-347378

(51) Int. Cl.
*G11B 5/39*    (2006.01)
(52) U.S. Cl. .............. 360/324.11; 360/324.12
(58) Field of Classification Search .......... None
See application file for complete search history.

(56) References Cited

U.S. PATENT DOCUMENTS

| | | | |
|---|---|---|---|
| 6,205,008 B1 * | 3/2001 | Gijs et al. ............ | 360/324 |
| 6,353,318 B1 * | 3/2002 | Sin et al. ............ | 324/252 |
| 6,611,405 B1 * | 8/2003 | Inomata et al. ....... | 360/324.2 |
| 6,721,149 B1 * | 4/2004 | Shi et al. ............ | 360/324.2 |
| 6,828,897 B1 * | 12/2004 | Nepela ............... | 338/32 R |
| 6,876,522 B2 * | 4/2005 | Ambrose et al. ..... | 360/324.11 |
| 6,937,447 B2 * | 8/2005 | Okuno et al. ........ | 360/324.1 |
| 7,035,062 B1 * | 4/2006 | Mao et al. ........... | 360/324.2 |
| 2003/0035255 A1 | 2/2003 | Hasegawa et al. | |
| 2003/0103299 A1 * | 6/2003 | Saito ................. | 360/324.12 |
| 2003/0197986 A1 | 10/2003 | Ambrose et al. | |
| 2004/0004261 A1 * | 1/2004 | Takahashi et al. ..... | 257/414 |

FOREIGN PATENT DOCUMENTS

| | | |
|---|---|---|
| JP | 8-250366 | 9/1996 |
| JP | 2002-319722 | 10/2002 |

OTHER PUBLICATIONS

Search Report dated Nov. 17, 2004 for British Patent Application No. 0421426.8.

\* cited by examiner

*Primary Examiner*—A. J. Heinz
(74) *Attorney, Agent, or Firm*—Brinks Hofer Gilson & Lione

(57) ABSTRACT

A magnetic sensing element using a Heusler alloy is provided. In the magnetic sensing element, a free magnetic layer composed of a Heusler alloy layer is disposed on a nonmagnetic layer that corresponds to an fcc layer having the face-centered cubic (fcc) structure. Equivalent crystal planes represented as [111] planes in the fcc structure, which are the closest packed planes, are exposed on the surface of the nonmagnetic layer.

16 Claims, 15 Drawing Sheets

MAGNETIC SENSING ELEMENT INCLUDING MAGNETIC LAYER COMPOSED OF HEUSLER ALLOY DISPOSED ON UNDERLAYER HAVING {111}-ORIENTED FCC STRUCTURE

This application claims the benefit of priority to Japanese Patent Application No. 2003-347378 filed on Oct. 6, 2003, herein incorporated by reference.

TECHNICAL FIELD

The present invention relates to a magnetic sensing element including a pinned magnetic layer in which the magnetization direction is pinned in one direction, a free magnetic layer, and a nonmagnetic layer disposed between the pinned magnetic layer and the free magnetic layer, and in particular, to a magnetic sensing element in which the amount of change in magnetoresistance can be increased.

BACKGROUND

FIG. 15 is a partial cross-sectional view of a known magnetic sensing element, i.e., spin-valve thin film element, cut from the direction parallel to a surface facing a recording medium.

Referring to FIG. 15, a base layer 1 is composed of Ta, and a seed layer 2 composed of a metal having a body-centered cubic (bcc) structure, for example Cr, is disposed on the base-layer 1.

A multilayer film T is deposited on the seed layer 2. In the multilayer film T, a free magnetic layer 3, a nonmagnetic layer 4, a pinned magnetic layer 5, an antiferromagnetic layer 6, and a protective layer 7 are disposed in that order.

The free magnetic layer 3 is composed of a Heusler alloy such as $Co_2MoAl$, the nonmagnetic layer 4 is composed of Cu, the pinned magnetic layer 5 is composed of CoFe, the antiferromagnetic layer 6 is composed of PtMn, and the protective layer 7 is composed of Ta.

An exchange coupling magnetic field is generated at the interface between the antiferromagnetic layer 6 and the pinned magnetic layer 5, thereby pinning the magnetization of the pinned magnetic layer 5 in the height direction (in the Y direction in the figure).

Hard bias layers 8 composed of a hard magnetic material such as CoPt are disposed at each end of the free magnetic layer 3. The upper parts, the lower parts, and the ends of the hard bias layers 8 are insulated by an insulating layer 9. The magnetization of the free magnetic layer 3 is aligned in the track width direction (in the X direction in the figure) by a longitudinal bias magnetic field from the hard bias layers 8.

When an external magnetic field is applied to the magnetic sensing element shown in FIG. 15, the magnetization direction of the free magnetic layer 3 is relatively changed to that of the pinned magnetic layer 5. Consequently, the resistance of the multilayer film is changed. Under a constant sense current, such a change in resistance is detected as the change in voltage, thus detecting the external magnetic field.

Japanese Unexamined Patent Application Publication No. 8-250366 discloses a magnetic sensing element including the free magnetic layer 3 composed of a Heusler alloy. The free magnetic layer 3 is disposed on the seed layer 2 composed of a metal having the bcc structure.

According to the above patent document, the free magnetic layer 3 composed of a Heusler alloy is disposed on the seed layer 2 composed of a metal having the bcc structure, and consequently, the free magnetic layer 3 can be formed as an adequately crystallized thin film.

However, if it is essential that the free magnetic layer 3 composed of a Heusler alloy is disposed on the seed layer 2 composed of a metal having the bcc structure, a pinned magnetic layer 5 composed of a Heusler alloy cannot be formed between the nonmagnetic layer 4 and the antiferromagnetic layer 6. The reason for this is that the nonmagnetic layer 4 and the antiferromagnetic layer 6 generally have the face-centered cubic (fcc) structure.

For the same reason, a bottom spin-valve giant magnetoresistive (GMR) magnetic sensing element cannot be formed. In the bottom spin-valve GMR magnetic sensing element, the antiferromagnetic layer 6, the pinned magnetic layer 5, the nonmagnetic layer 4, and the free magnetic layer 3 are sequentially deposited from the bottom to form a multilayer film.

BRIEF SUMMARY

As described above, the design of the magnetic sensing element is considerably limited in the known art. In order to solve the above problems, it is an object of the present invention to provide a magnetic sensing element including a free magnetic layer and/or a pinned magnetic layer composed of a Heusler alloy. According to the present invention, the design of the magnetic sensing element can be diversified.

The present invention provides a magnetic sensing element including at least one pinned magnetic layer in which the magnetization direction is pinned in one direction and a free magnetic layer. At least one nonmagnetic layer is disposed between the at least one pinned magnetic layer and the free magnetic layer. At least one of the free magnetic layer and the pinned magnetic layer includes a Heusler alloy layer, and the Heusler alloy layer is disposed on a fcc layer having the face-centered cubic (fcc) structure, in which equivalent crystal planes represented as [111] planes are preferentially oriented in the direction parallel to the surface of the fcc layer.

The present inventors have found that in deposition of the thin film composed of a Heusler alloy, the underlayer need not be a seed layer having a body-centered cubic (bcc) structure.

According to the present invention, the Heusler alloy layer is formed on the fcc layer having the fcc structure, in which equivalent crystal planes represented as [111] planes are preferentially oriented in a direction parallel to the surface of the fcc layer. As a result, the Heusler alloy layer has an adequate Heusler crystal structure, and in addition, the ratio of change in magnetoresistance of the magnetic sensing element can be improved.

The reason for this is as follows. The [111] planes in the fcc structure are the closest packed planes. Therefore, diffusion of the atoms in the Heusler alloy layer into the fcc layer can be suppressed. After deposition, it is necessary that the Heusler alloy layer forms a superlattice by arranging the elements at fixed positions of the crystal lattices. When the Heusler alloy layer is deposited on the closest packed planes of the fcc layer, atoms in the Heusler alloy are readily moved in the direction parallel to the layer surface. Accordingly, the atomic positions are readily exchanged so as to form the superlattice.

Furthermore, even when the Heusler alloy layer is annealed after deposition to readily form the superlattice, interfacial diffusion between the Heusler alloy layer and the fcc layer can be minimized.

The Heusler alloy layer preferably has a body-centered cubic (bcc) structure, in which equivalent crystal planes represented as [220] planes are preferentially oriented in the direction parallel to the layer surface. Since the [220] planes in the bcc structure are the closest packed planes, interdiffusion between the atoms in the Heusler alloy layer and the atoms in the fcc layer can be suppressed at the interface. The atomic positions in the Heusler alloy layer are more readily exchanged so as to form the superlattice.

The fcc layer may be at least one nonmagnetic layer forming the magnetic sensing element. The fcc layer may be a sublayer forming at least a part of the free magnetic layer. The fcc layer may also be a sublayer forming at least a part of the pinned magnetic layer. Further, the fcc layer may be a seed layer disposed under the free magnetic layer.

As described above, according to the present invention, the design of the magnetic sensing element can be diversified.

The average grain size of the Heusler alloy layer in the direction parallel to the layer surface is preferably at least about 50 Å, and more preferably, at least about 100 Å. Since the increase in the average grain size decreases the crystal grain boundary, spin-independent interface scattering of the conduction electrons can be decreased.

A columnar crystal is preferably formed, in which a crystal grain boundary formed in the fcc layer, the crystal grain boundary appearing in a cut surface in the direction parallel to the thickness of the fcc layer, and a crystal grain boundary formed in the Heusler alloy layer are continuous. The presence of this columnar crystal decreases spin-independent scattering of the conduction electrons at the grain boundary and increases the ratio of change in magnetoresistance.

In particular, in the columnar crystal, the crystals of the fcc layer are preferably matched with the crystals of the Heusler alloy layer in a heteroepitaxial state.

The Heusler alloy layer may be composed of, for example, a metallic compound having a Heusler crystal structure and represented by a composition formula $X_2YZ$ or XYZ, wherein X is at least one element selected from the group consisting of Cu, Co, Ni, Rh, Pt, Au, Pd, Ir, Ru, Ag, Zn, Cd, and Fe; Y is at least one element selected from the group consisting of Mn, Fe, Ti, V, Zr, Nb, Hf, Ta, Cr, Co, and Ni; and Z is at least one element selected from the group consisting of Al, Sn, In, Sb, Ga, Si, Ge, Pb, and Zn.

The Heusler alloy layer is preferably composed of a metallic compound represented by a composition formula $X_2MnZ$, wherein X is at least one element selected from the group consisting of Cu, Co, Ni, Au, and Pd; and Z is at least one element selected from the group consisting of Al, Sn, In, Sb, Ga, Si, and Ge.

The Heusler alloy layer is more preferably composed of a metallic compound represented by a composition formula $Co_2MnZ$, wherein Z is at least one element selected from the group consisting of Al, Sb, Si, and Ge.

In the present invention, the magnetic sensing element may further include at least one antiferromagnetic layer. The at least one pinned magnetic layer is formed in contact with the at least one antiferromagnetic layer, and the magnetization direction of the at least one pinned magnetic layer is pinned by the exchange anisotropic magnetic field with the at least one antiferromagnetic layer.

In the present invention, a first nonmagnetic layer may be disposed on the free magnetic layer, a second nonmagnetic layer may be disposed under the free magnetic layer. A first pinned magnetic layer may be disposed on the first nonmagnetic layer, and a second pinned magnetic layer may be disposed under the second nonmagnetic layer.

In the above case, preferably, the magnetic sensing element further includes a first antiferromagnetic layer disposed on the pinned magnetic layer and a second antiferromagnetic layer disposed under the second pinned magnetic layer. The first and second antiferromagnetic layers pin the magnetization direction of the first and second pinned magnetic layers, respectively, in one direction by the exchange anisotropic magnetic field.

The present invention is effectively applicable to a current perpendicular to the plane-giant magnetoresistive (CPP-GMR) magnetic sensing element or a current perpendicular to the plane-tunnel magnetoresistive (CPP-TMR) magnetic sensing element, wherein a sense current flows in the direction perpendicular to the surface of the at least one pinned magnetic layer, the at least one nonmagnetic layer, and the free magnetic layer.

The term "Heusler alloy" is a generic term of metallic compounds having a Heusler crystal structure. The Heusler alloys show ferromagnetism depending on the composition. The Heusler alloys are metals having a large spin-polarizability and are half-metals wherein-most of the conduction electrons are composed of either only up-spin electrons or only down-spin electrons.

The use of a Heusler alloy as the material of at least one of the free magnetic layer and the pinned magnetic layer in the CPP-GMR or CPP-TMR magnetic sensing element has the following advantage. The use of the Heusler alloy increases the change in spin diffusion length or the change in the mean free path of the conduction electrons in the magnetic sensing element. Such a change is based on the change in spin-dependent bulk scattering caused by the application of an external magnetic field. In other words, the use of the Heusler alloy increases the amount of change in the resistance of the magnetic sensing element. As a result, the detection sensitivity of the external magnetic field is improved.

According to the present invention, the Heusler alloy layer is formed on the fcc layer having the fcc structure, in which equivalent crystal planes represented as [111] planes are preferentially oriented in the direction parallel to the surface of the fcc layer. Thus, the Heusler alloy layer having an adequate Heusler crystal structure can be formed, and in addition, the ratio of change in magnetoresistance of the magnetic sensing element can be improved.

The Heusler alloy layer has a bcc structure, in which equivalent crystal planes represented as [220] planes are preferentially oriented in the direction parallel to the layer surface. As a result, the atomic positions in the Heusler alloy layer are more readily exchanged so as to form the superlattice.

According to the present invention, the fcc layer on which the Heusler alloy layer is formed may be, for example, at least one nonmagnetic layer, the sublayer that forms the free magnetic layer, the sublayer that forms the pinned magnetic layer, or the seed layer disposed under the free magnetic layer. Accordingly, the present invention can diversify the design of the magnetic sensing element.

DETAILED DESCRIPTION OF THE PREFERRED EMBODIMENTS

First Embodiment

Figure 1:
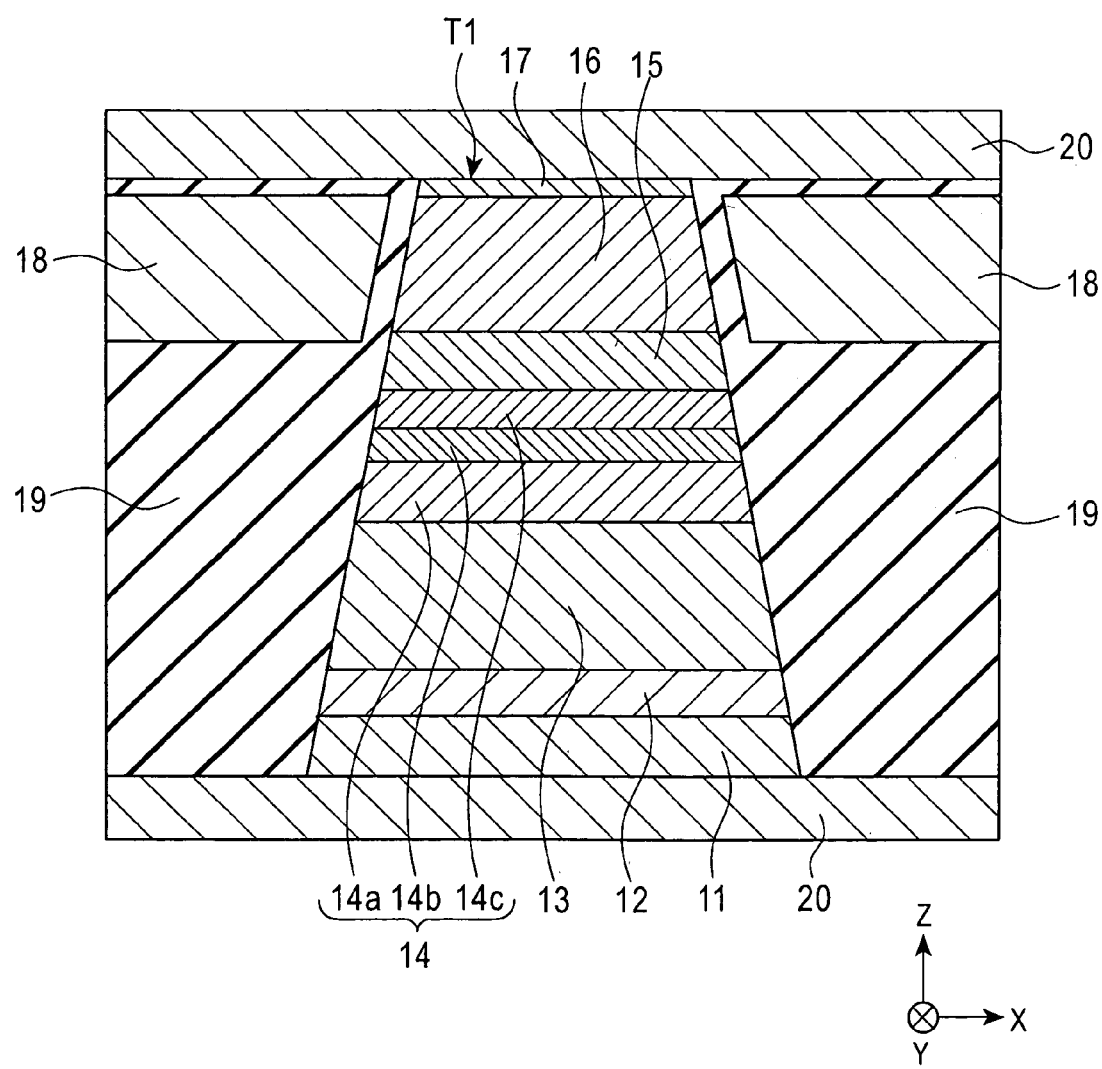
FIG. 1 is a cross-sectional view of the structure of a magnetic sensing element (single spin-valve magnetoresistive element) according to a first embodiment of the present invention, viewed from a surface facing a recording medium.

FIG. 1 is a cross-sectional view of an overall structure of a magnetic sensing element (single spin-valve magnetoresistive element) according to a first embodiment of the present invention, viewed from a surface facing a recording medium. FIG. 1 shows only the central portion of the sensing element expanding in the X direction.

For example, this single spin-valve magnetoresistive element is mounted at the trailing edge of a floating slider installed in a hard disk device to detect magnetic fields recorded on a hard disk. A magnetic recording medium such as a hard disk moves in the Z direction, and the leakage magnetic field from the magnetic recording medium is in the Y direction.

Referring to FIG. 1, a base layer 11 is deposited at the bottom. The base layer 11 is composed of a nonmagnetic material, for example, at least one element selected from Ta, Hf, Nb, Zr, Ti, Mo, and W. A multilayer film T1 is deposited on the base layer 11. The multilayer film T1 includes a seed layer 12, an antiferromagnetic layer 13, a pinned magnetic layer 14, a nonmagnetic layer 15, a free magnetic layer 16, and a protective layer 17. The magnetic sensing element shown in FIG. 1 is a bottom spin-valve GMR magnetic sensing element in which the antiferromagnetic layer 13 is disposed under the free magnetic layer 16.

The seed layer 12 is composed of NiFeCr or Cr. The seed layer 12 composed of NiFeCr has the face-centered cubic (fcc) structure, in which equivalent crystal planes represented as [111] planes are preferentially oriented in the direction parallel to the layer surface. The seed layer 12 composed of Cr has a body-centered cubic (bcc) structure, in which equivalent crystal planes represented as [110] planes are preferentially oriented in the direction parallel to the layer surface.

The base layer 11 substantially has an amorphous structure. The formation of this base layer 11 is not essential.

The antiferromagnetic layer 13 disposed on the seed layer 12 is preferably composed of an antiferromagnetic material containing X and Mn, wherein X is at least one element selected from Pt, Pd, Ir, Rh, Ru, and Os.

The antiferromagnetic layer 13 has the fcc structure or the face-centered tetragonal (fct) structure.

These X-Mn alloys containing an element of the platinum group are excellent as antiferromagnetic materials because they have superior corrosion resistance and high blocking temperatures and can generate large exchange coupling magnetic fields ($H_{ex}$). In particular, platinum (Pt) is preferably used among the elements of the platinum group. For example, a binary PtMn alloy is used.

According to the present invention, the antiferromagnetic layer 13 may also be composed of an antiferromagnetic material containing X, X', and Mn, wherein X' is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

The following element or elements are preferably used as X': an element or elements that enter the interstices in the space lattice formed by X and Mn to form an interstitial solid solution; alternatively, the element or elements that partially replace lattice points of the crystal lattice formed by X and Mn to form a substitutional solid solution. Herein, the term "solid solution" refers to a solid in which its components are homogeneously mixed over wide ranges.

The interstitial or substitutional solid solution composed of the X—Mn—X' alloy has a larger lattice constant compared with that of the X—Mn alloy layer. As a result, the difference between the lattice constant of the antiferromagnetic layer 13 and that of the pinned magnetic layer 14 can be increased so that the boundary structure between the antiferromagnetic layer 13 and the pinned magnetic layer 14 are readily mismatched. Herein, a term "mismatched state" refers to a state in which atoms in the antiferromagnetic layer 13 and the atoms in the pinned magnetic layer 14 do not generate one-to-one correspondence at the interface between the antiferromagnetic layer 13 and the pinned magnetic layer 14.

In particular, when an element or elements that form a substitutional solid solution are used as X', an excessive X' content deteriorates the antiferromagnetic property and decreases the magnitude of the exchanging coupling magnetic field generated at the interface with the pinned magnetic layer 14. According to the present invention, at least one inert rare gas element selected from Ne, Ar, Kr, and Xe that forms an interstitial solid solution is preferably used as X'. Rare gas element are inert, therefore, even when the layer includes these rare gas elements, the rare gases barely affect the antiferromagnetic properties. For example, argon (Ar), which is often introduced in sputtering apparatuses as a sputtering gas, can readily enter the layer by simply optimizing the gas pressure.

When a gaseous element or elements are used as X', a high content of X' in the layer is difficult to achieve. However, even a small amount of the rare gas contained in the layer significantly increases the exchange coupling magnetic field generated by annealing.

According to the present invention, the X' content is preferably in the range of about 0.2 to about 10 atomic percent, and more preferably, in the range of about 0.5 to about 5 atomic percent. According to the present invention, the element represented by X is preferably Pt, and therefore, an alloy composed of Pt—Mn—X' is preferably used.

According to the present invention, the X content or the X+X' content in the antiferromagnetic layer 13 is preferably in the range of about 45 to about 60 atomic percent, and more preferably, in the range of about 49 to about 56.5 atomic percent. In this case, the interface with the pinned magnetic layer 14 is put into the mismatched state during deposition, and the antiferromagnetic layer 13 can achieve an adequate order transformation by annealing.

The pinned magnetic layer 14 disposed on the antiferromagnetic layer 13 has a triple layer structure. The pinned magnetic layer 14 includes a first magnetic sublayer 14a, a nonmagnetic interlayer 14b, and a second magnetic sublayer 14c. The first magnetic sublayer 14a is magnetized in the direction antiparallel to the magnetization direction of the second magnetic sublayer 14c by the exchange coupling magnetic field generated at the interface with the antiferromagnetic layer 13 and by the antiferromagnetic exchange coupling magnetic field (Ruderman-Kittel-Kasuya-Yoshida interaction, i.e., RKKY interaction) through the nonmagnetic interlayer 14b. This antiparallel state, which is known as a synthetic ferrimagnetic coupling state, can stabilize the magnetization of the pinned magnetic layer 14 and increase the apparent exchange coupling magnetic field generated at the interface between the pinned magnetic layer 14 and the antiferromagnetic layer 13.

Alternatively, the pinned magnetic layer 14 may be formed as a single layer composed of a magnetic layer or as a multilayer composed of magnetic sublayers.

For example, the first magnetic sublayer 14a has a thickness of about 15 to about 35 Å, the nonmagnetic interlayer 14b has a thickness of about 8 to about 10 Å, and the second magnetic sublayer 14c has a thickness of about 20 to about 50 Å.

The first magnetic sublayer 14a and the second magnetic sublayer 14c are composed of a ferromagnetic material such as CoFe or NiFe. The nonmagnetic interlayer 14b is composed of a nonmagnetic conductive material such as Ru, Rh, Ir, Cr, Re, or Cu.

The nonmagnetic layer 15 disposed on the pinned magnetic layer 14 is composed of Cu, Au, or Ag. The nonmagnetic layer 15 composed of Cu, Au, or Ag has the fcc structure. In the nonmagnetic layer 15, equivalent crystal planes represented as [111] planes are preferentially oriented in the direction parallel to the layer surface. This nonmagnetic layer 15 corresponds to an fcc layer of the present invention.

The free magnetic layer 16 is further disposed on the nonmagnetic layer 15. According to the present embodiment, the free magnetic layer 16 is composed of a Heusler alloy. This free magnetic layer 16 corresponds to the Heusler alloy layer of the present invention.

In the embodiment shown in FIG. 1, hard bias layers 18 are disposed at each end of the free magnetic layer 16. The magnetization of the free magnetic layer 16 is aligned in the track width direction (in the X direction in the figure) by a longitudinal bias magnetic field from the hard bias layers 18. For example, the hard bias layers 18 are composed of a cobalt-platinum (Co—Pt) alloy or a cobalt-chromium-platinum (Co—Cr—Pt) alloy.

The upper parts, the lower parts, and the ends of the hard bias layers 18 are insulated by an insulating layer 19 composed of, for example, alumina.

Electrode layers 20 are disposed on and under the multilayer film T1. The magnetic sensing element of the present embodiment is a current perpendicular to the plane-giant magnetoresistive (CPP-GMR) magnetic sensing element in which a sense current flows in the direction perpendicular to the surface of each layer of the multilayer film T1.

For example, the electrode layers 20 are composed of α-Ta, Au, Cr, Cu, Rh, Ir, Ru, or W.

In preparation of the spin-valve thin film element shown in FIG. 1, the layers are sequentially deposited from the base layer 11 up to the protective layer 17, and the layers are then annealed so as to generate the exchange coupling magnetic field at the interface between the antiferromagnetic layer 13 and the pinned magnetic layer 14. During annealing, magnetization of the pinned magnetic layer 14 is pinned in the Y direction in the figure by applying a magnetic field in the Y direction. In the embodiment shown in FIG. 1, the pinned magnetic layer 14 has a laminated ferrimagnetic structure. Therefore, for example, when the first magnetic sublayer 14a is magnetized in the Y direction in the figure, the second magnetic sublayer 14c is magnetized in the direction opposite to the Y direction. In addition, the free magnetic layer (Heusler alloy layer) 16 forms a superlattice by annealing.

In the magnetic sensing element shown in FIG. 1, the magnetization direction of the pinned magnetic layer 14 is orthogonal to that of the free magnetic layer 16. A leakage magnetic field from a recording medium enters the magnetic sensing element in the Y direction in the figure. The magnetization of the free magnetic layer 16 is sensitively changed in response to the magnetic field. The electrical resistance is changed according to the relationship between the above change in the magnetization direction and the pinned magnetization direction of the pinned magnetic layer 14. The leakage magnetic field from the recording medium is detected by changes in voltage or current based on the change in the electrical resistance.

The free magnetic layer (Heusler alloy layer) 16 is composed of a metallic compound having a Heusler crystal structure and represented by a composition formula, for example, $X_2YZ$ or XYZ, wherein X is at least one element selected from Cu, Co, Ni, Rh, Pt, Au, Pd, Ir, Ru, Ag, Zn, Cd, and Fe; Y is at least one element selected from Mn, Fe, Ti, V, Zr, Nb, Hf, Ta, Cr, Co, and Ni; and Z is at least one element selected from Al, Sn, In, Sb, Ga, Si, Ge, Pb, and Zn.

The free magnetic layer (Heusler alloy layer) 16 is preferably composed of a metallic compound represented by a composition formula $X_2MnZ$, wherein X is at least one element selected from Cu, Co, Ni, Au, and Pd; and Z is at least one element selected from Al, Sn, In, Sb, Ga, Si, and Ge.

More preferably, the free magnetic layer (Heusler alloy layer) 16 is composed of a metallic compound represented by a composition formula $Co_2MnZ$, wherein Z is at least one element selected from Al, Sb, Si, and Ge.

The term "Heusler alloy", which represents the material of the free magnetic layer 16, is a generic term of metallic compounds having a Heusler crystal structure. The Heusler alloys show ferromagnetism depending on the composition. The Heusler alloys are metals having a large spin-polarizability and are half-metals wherein most of the conduction electrons are composed of either only up-spin electrons or only down-spin electrons.

The use of a Heusler alloy as the material of the free magnetic layer 16 in the CPP-GMR magnetic sensing element has the following advantage: The use of the Heusler alloy increases the change in spin diffusion length or the change in mean free path of the conduction electrons in the free magnetic layer 16, the change being caused by applying an external magnetic field. In other words, the use of the Heusler alloy increases the change in the resistance of the multilayer film, thereby improving the detection sensitivity of the external magnetic field.

In the present embodiment, the free magnetic layer 16 composed of the Heusler alloy is disposed on the nonmagnetic layer 15 composed of Cu.

The nonmagnetic layer 15 composed of Cu is the fcc layer having the fcc structure, in which equivalent crystal planes represented as [111] planes are preferentially oriented in the direction parallel to the layer surface.

The [111] planes in the fcc structure, which are the closest packed planes, are exposed on the surface of the nonmagnetic layer 15. Therefore, diffusion of the atoms in the free magnetic layer (Heusler alloy layer) 16, which is formed on the nonmagnetic layer 15, into the nonmagnetic layer 15 can be suppressed.

After deposition, it is necessary that the free magnetic layer 16 composed of the Heusler alloy forms the superlattice by arranging the elements at fixed positions of the crystal lattices. When the free magnetic layer 16 is deposited on the closest packed planes of the nonmagnetic layer 15, atoms in the Heusler alloy are readily moved in the direction parallel to the layer surface. Accordingly, the atomic positions are readily exchanged so as to form the superlattice.

Even when the Heusler alloy is annealed after deposition to readily form the superlattice, interfacial diffusion between the free magnetic layer 16 and the nonmagnetic layer 15 can be minimized.

According to the present embodiment, the free magnetic layer 16 composed of the above Heusler alloy is formed on the fcc layer. Consequently, the free magnetic layer 16 has the bcc structure, in which equivalent crystal planes represented as [220] planes are preferentially oriented in the direction parallel to the layer surface.

The [220] planes in the bcc structure are the closest packed planes, and therefore, interdiffusion between the atoms in the free magnetic layer 16 and the atoms in the nonmagnetic layer 15 at the interface can be suppressed. The atomic positions in the Heusler alloy are more readily exchanged so as to form the superlattice.

Consequently, in the magnetic sensing element having a free magnetic layer composed of the Heusler alloy, the ratio of change in magnetoresistance is increased, thereby improving the detection sensitivity of the external magnetic field.

In the free magnetic layer (Heusler alloy layer) 16, the average grain size in the direction parallel to the layer surface is preferably at least about 50 Å, and more preferably, at least about 100 Å. Since the increase in the average grain size decreases the crystal grain boundary, spin-independent interface scattering of the conduction electrons can be decreased. In addition, a columnar crystal is preferably formed, in which a crystal grain boundary formed in the nonmagnetic layer 15, the crystal grain boundary appearing in a cut surface in the direction parallel to the thickness of the nonmagnetic layer 15, and a crystal grain boundary formed in the free magnetic layer 16 are continuous. In this case, spin-independent scattering of the conduction electrons at the grain boundary can be decreased, thus increasing the ratio of change in magnetoresistance.

In particular, in the columnar crystal, the crystals of the nonmagnetic layer 15 are preferably matched with the crystals of the free magnetic layer 16 in a heteroepitaxial state.

Figure 5:
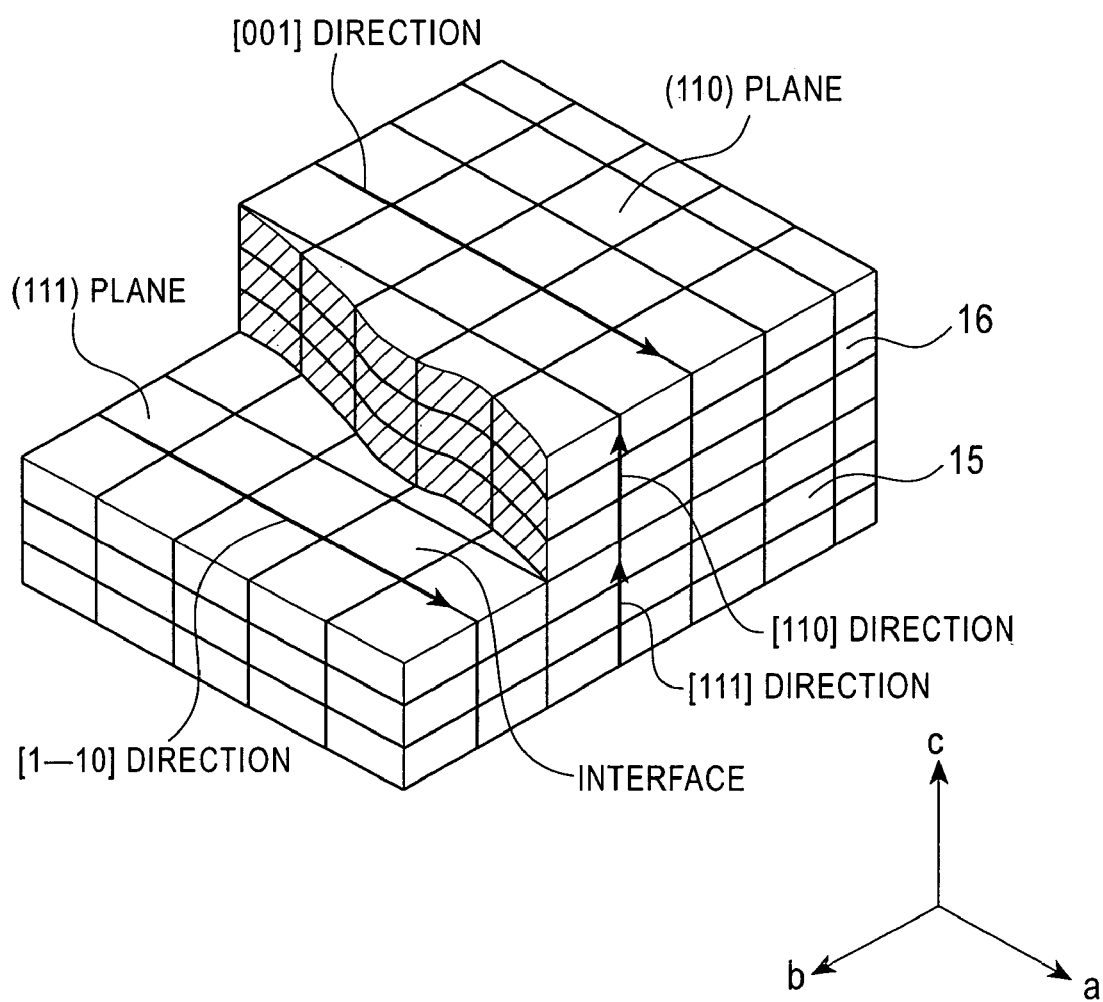
FIG. 5 is a schematic view showing crystal orientations of an fcc layer and a Heusler alloy layer according to the present invention.

When the crystals of the nonmagnetic layer 15 are matched with those of the free magnetic layer 16 in a heteroepitaxial state, the nonmagnetic layer 15 and the free magnetic layer 16 are deposited such that the crystal axes of the nonmagnetic layer 15 are parallel to those of the free magnetic layer 16. Consequently, at the interface between the nonmagnetic layer 15 and the free magnetic layer 16, the equivalent crystal planes are preferentially oriented in the direction parallel to the interface. Furthermore, the crystal axis of the nonmagnetic layer 15 and that of the free magnetic layer 16 lying in the above crystal planes are directed in the same direction. As a result, atomic arrangement in the nonmagnetic layer 15 and that in the free magnetic layer 16 readily generate one-to-one correspondence at the interface (see, FIG. 5). As shown in an example in FIG. 5, the <1-10>direction lying in the [111] plane of the fcc layer and the <011> direction lying in the [110] plane of the Heusler alloy layer are the same direction.

In the present invention, it is sufficient that the crystals of the nonmagnetic layer 15 are matched with the crystals of the free magnetic layer 16 in a heteroepitaxial state in one single columnar crystal. Accordingly, as shown in FIG. 6, in the other columnar crystal, the direction of a crystal axis of the nonmagnetic layer 15 need not be parallel to that of the free magnetic layer 16.

Figure 6:
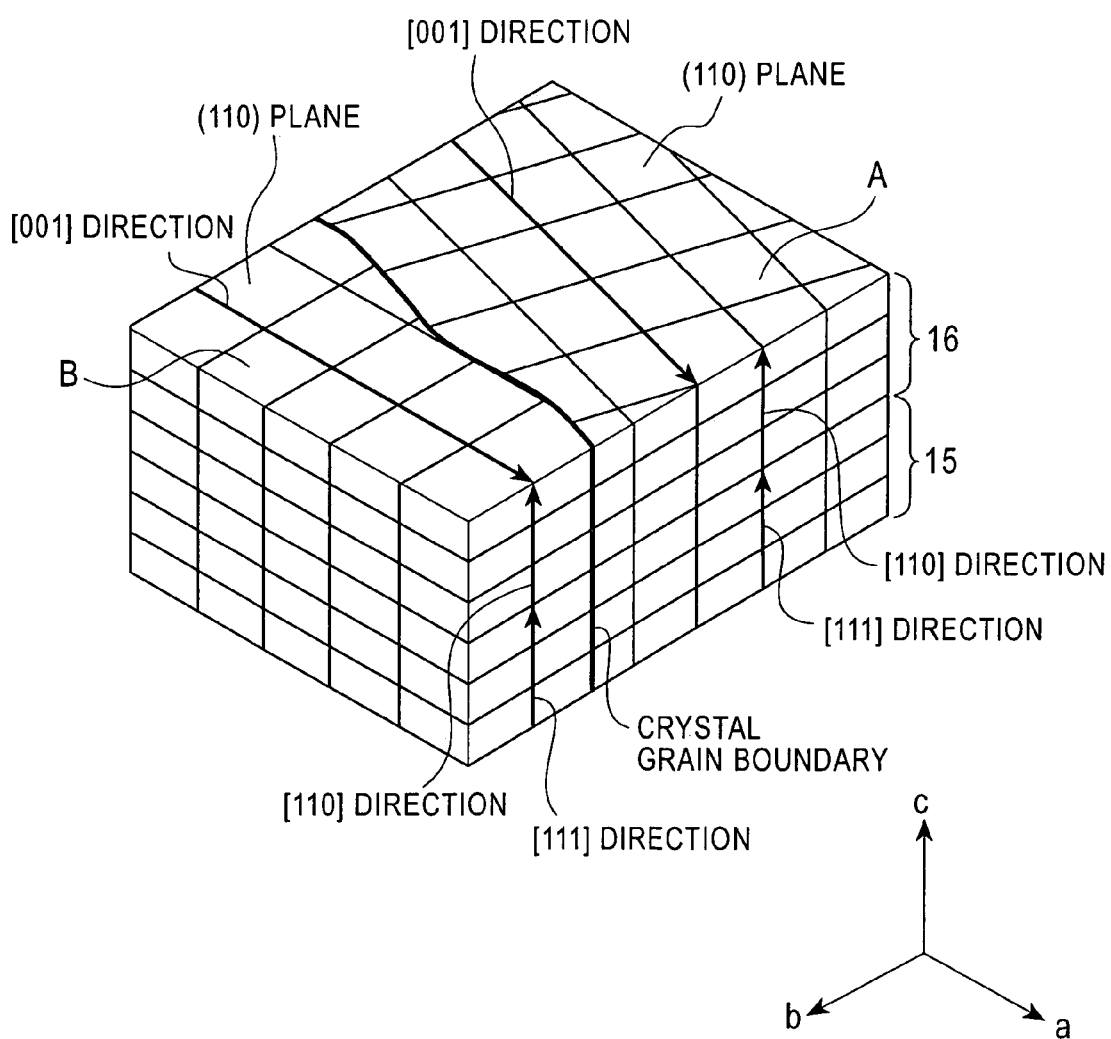
FIG. 6 is a schematic view showing crystal orientations of the fcc layer and the Heusler alloy layer according to the present invention.

Referring to FIG. 6, in a columnar crystal A, the crystals of the nonmagnetic layer 15 are matched with those of the free magnetic layer 16 in a heteroepitaxial state, and all crystal orientations are parallel between the crystals of the nonmagnetic layer 15 and those of the free magnetic layer 16. Also, in a columnar crystal B shown in FIG. 6, the crystals of the nonmagnetic layer 15 are matched with those of the free magnetic layer 16 in a heteroepitaxial state, and all crystal orientations are parallel between the crystals of the nonmagnetic layer 15 and those of the free magnetic layer 16.

According to the present embodiment, the free magnetic layer 16 is composed of a single Heusler alloy layer. The free magnetic layer may have a laminated structure including a layer composed of a ferromagnetic material such as NiFe or CoFe, and a Heusler alloy layer. Alternatively, the free magnetic layer may have a synthetic ferrimagnetic structure, in which the layer composed of a ferromagnetic material and the Heusler alloy layer are antiferromagnetically coupled by the RKKY interaction through a nonmagnetic interlayer composed of a nonmagnetic material.

As shown in FIG. 1, the multilayer film T1 has a trapezoidal shape in which the dimension in the track width direction is converged toward the upper layer. In the bottom spin-valve magnetic sensing element of the present embodiment, the free magnetic layer 16 is disposed above the antiferromagnetic layer 13 and the pinned magnetic layer 14. In this magnetic sensing element, the dimension of the free magnetic layer 16 in the track width direction (in the X direction in the figure), which defines the track width of the magnetic sensing element, can be readily decreased, compared with that of a top spin-valve magnetic sensing element which will be described later.

Second Embodiment

Figure 2:
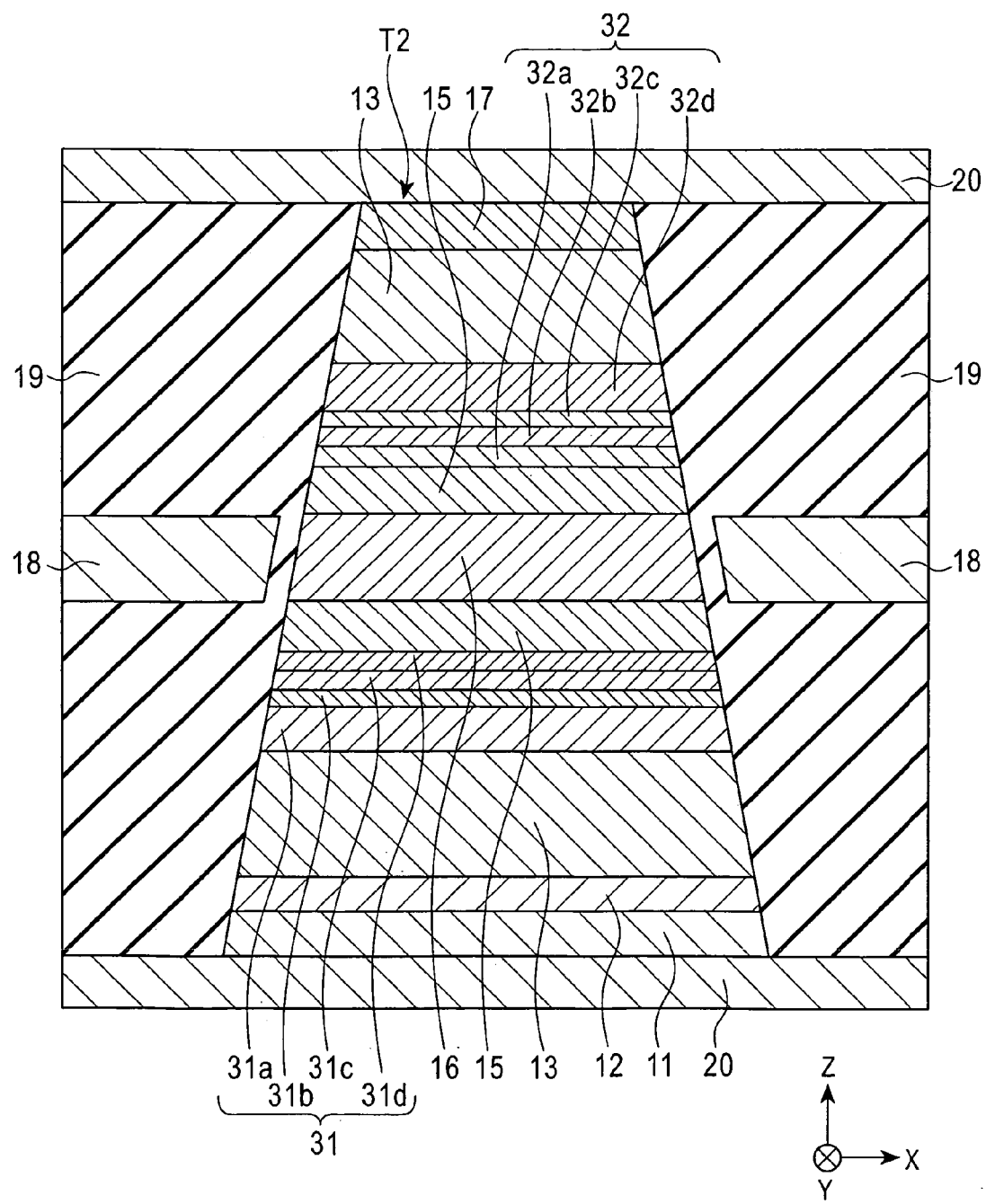
FIG. 2 is a cross-sectional view of the structure of a magnetic sensing element (dual spin-valve magnetoresistive element) according to a second embodiment of the present invention, viewed from a surface facing a recording medium.

FIG. 2 is a partial cross-sectional view showing a structure of a dual spin-valve magnetic sensing element according to a second embodiment of the present invention.

Referring to FIG. 2, from the bottom, a base layer 11, a seed layer 12, an antiferromagnetic layer 13, a pinned magnetic layer 31, a nonmagnetic layer 15, and a free magnetic layer 16, which is a Heusler alloy layer, are sequentially deposited. Furthermore, on the free magnetic layer 16, another nonmagnetic layer 15, a pinned magnetic layer 32, another antiferromagnetic layer 13, and a protective layer 17 are sequentially deposited to form a multilayer film T2.

Hard bias layers 18 are disposed at each end of the free magnetic layer 16. The hard bias layers 18 are insulated by an insulating layer 19 composed of, for example, alumina.

Electrode layers 20 are disposed on and under the multilayer film T2. The magnetic sensing element of the present embodiment is a CPP-GMR magnetic sensing element in which a sense current flows in the direction perpendicular to the surface of each layer of the multilayer film T2.

In FIG. 2, layers having the same reference numeral as in FIG. 1 are composed of the same materials as those in FIG. 1. The pinned magnetic layer 31 of the magnetic sensing element shown in FIG. 2 has a quadruple layer structure including a third magnetic sublayer 31a, a nonmagnetic interlayer 31b, a fourth magnetic sublayer 31c, and a Heusler alloy sublayer 31d. Herein, the term "Heusler alloy sublayer" is used as a matter of convenience, and the Heusler alloy sublayer has the same function as the above Heusler alloy layer. The third magnetic sublayer 31a and the fourth magnetic sublayer 31c are composed of a ferromagnetic material having the fcc structure such as CoFe. The Heusler alloy sublayer 31d is composed of a Heusler alloy that will be described later. The Heusler alloy sublayer 31d is ferromagnetic, and the magnetization of the fourth magnetic sublayer 31c and that of the Heusler alloy sublayer 31d are directed in the same direction by the ferromagnetic coupling.

The third magnetic sublayer 31a is magnetized in the direction antiparallel to the magnetization direction of the fourth magnetic sublayer 31c and the Heusler alloy sublayer 31d by the exchange coupling magnetic field generated at the interface with the antiferromagnetic layer 13 and by the antiferromagnetic exchange coupling magnetic field (RKKY interaction) through the nonmagnetic interlayer 31b.

The Heusler alloy sublayer 31d, which is one of the sublayers in the pinned magnetic layer 31', is composed of a metallic compound having a Heusler crystal structure and represented by a composition formula, for example, $X_2YZ$ or XYZ, wherein X is at least one element selected from Cu, Co, Ni, Rh, Pt, Au, Pd, Ir, Ru, Ag, Zn, Cd, and Fe; Y is at least one element selected from Mn, Fe, Ti, V, Zr, Nb, Hf, Ta, Cr, Co, and Ni; and Z is at least one element selected from Al, Sn, In, Sb, Ga, Si, Ge, Pb, and Zn.

The Heusler alloy sublayer 31d is preferably composed of a metallic compound represented by a composition formula $X_2MnZ$, wherein X is at least one element selected from Cu, Co, Ni, Au, and Pd; and Z is at least one element selected from Al, Sn, In, Sb, Ga, Si, and Ge.

More preferably, the Heusler alloy sublayer 31d is composed of a metallic compound represented by a composition formula $Co_2MnZ$, wherein Z is at least one element selected from Al, Sb, Si, and Ge.

According to the present embodiment, the Heusler alloy sublayer 31d is disposed on the fourth magnetic sublayer 31c. The fourth magnetic sublayer 31c is composed of CoFe and has the fcc structure, in which equivalent crystal planes represented as [111] planes are preferentially oriented in the direction parallel to the layer surface. This fourth magnetic sublayer 31c corresponds to the fcc layer of the present invention.

The pinned magnetic layer 32 of the magnetic sensing element shown in FIG. 2 has a quadruple layer structure including a Heusler alloy sublayer 32a, a first magnetic sublayer 32b, a nonmagnetic interlayer 32c, and a second magnetic sublayer 32d. The first magnetic sublayer 32b and the second magnetic sublayer 32d are composed of a ferromagnetic material having the fcc structure, for example, CoFe. The Heusler alloy sublayer 32a is composed of the same Heusler alloy as that of the Heusler alloy sublayer 31d in the above pinned magnetic layer 31. The first magnetic sublayer 32b is ferromagnetic, and the magnetization of the Heusler alloy sublayer 32a and that of the first magnetic sublayer 32b are directed in the same direction by the ferromagnetic coupling.

The second magnetic sublayer 32d is magnetized in the direction antiparallel to the magnetization direction of the Heusler alloy sublayer 32a and first magnetic sublayer 32b by the exchange coupling magnetic field generated at the interface with the antiferromagnetic layer 13 disposed on the pinned magnetic layer 32 and by the antiferromagnetic exchange coupling magnetic field (RKKY interaction) through the nonmagnetic interlayer 32c.

The term "Heusler alloy", which represents the material of the Heusler alloy sublayers 31d and 32a, is a generic term of metallic compounds having a Heusler crystal structure. The Heusler alloys show ferromagnetism depending on the composition. The Heusler alloys are metals having a large spin-polarizability and are half-metals wherein most of the conduction electrons are composed of either only up-spin electrons or only down-spin electrons.

In the above CPP-GMR magnetic sensing element, the pinned magnetic layer 31 includes the Heusler alloy sublayer 31d and the pinned magnetic layer 32 includes the Heusler alloy sublayer 32a. This structure increases the change in spin diffusion length or the change in mean free path of the conduction electrons in the multilayer film T2, the change being caused by applying an external magnetic field. In other words, the above structure increases the change in the resistance of the multilayer film T2, thereby improving the detection sensitivity of the external magnetic field.

According to the present embodiment, the Heusler alloy sublayer 31d is disposed on the fourth magnetic sublayer 31c, which corresponds to the fcc layer of the present invention. The Heusler alloy sublayer 32a is disposed on the nonmagnetic layer 15, which corresponds to the fcc layer of the present invention.

The fcc layer of the present invention has the fcc structure, in which equivalent crystal planes represented as [111] planes are preferentially oriented in the direction parallel to the layer surface.

The [111] planes in the fcc structure, which are the closest packed planes, are exposed on the surfaces of the fourth magnetic sublayer 31c and the nonmagnetic layer 15. Therefore, diffusion of the atoms in the Heusler alloy sublayer 31d into the fourth magnetic sublayer 31c can be suppressed. In addition, diffusion of the atoms in the Heusler alloy sublayer 32a into the nonmagnetic layer 15 can be suppressed.

After deposition, it is necessary that the Heusler alloy sublayers 31d and 32a form a superlattice by arranging the elements at fixed positions of the crystal lattices. When the Heusler alloy sublayers 31d and 32a are deposited on the closest packed planes, atoms in the Heusler alloys are readily moved in the direction parallel to the layer surfaces. Accordingly, the atomic positions are readily exchanged so as to form the superlattice.

Even when the Heusler alloy sublayers 31d and 32a are annealed after deposition to readily form the superlattice, interfacial diffusion between the Heusler alloy sublayer 31d and the fourth magnetic sublayer 31c, and interfacial diffusion between the Heusler alloy sublayer 32a and the nonmagnetic layer 15 can be minimized.

According to the present embodiment, the Heusler alloy sublayers 31d and 32a are composed of the above Heusler alloy. Consequently, each of the Heusler alloy sublayer 31d and the Heusler alloy sublayer 32a has the bcc structure, in which equivalent crystal planes represented as [220] planes are preferentially oriented in the direction parallel to the layer surface.

The [220] planes in the bcc structure are the closest packed planes. Therefore, interdiffusion between the atoms in the Heusler alloy sublayer 31d and the atoms in the fourth magnetic sublayer 31c at the interface can be suppressed. In addition, interdiffusion between the atoms in the Heusler alloy sublayer 32a and the atoms in the nonmagnetic layer 15 at the interface can be suppressed. The atomic positions in the Heusler alloy are more readily exchanged so as to form the superlattice.

Consequently, in this magnetic sensing element having a free magnetic layer composed of the Heusler alloy and pinned magnetic layers composed of the Heusler alloy, the ratio of change in magnetoresistance is increased, thereby improving the detection sensitivity of the external magnetic field.

In the Heusler alloy sublayers 31d and 32a, the average grain size in the direction parallel to the layer surface is preferably at least about 50 Å, and more preferably, at least about 100 Å. Since the increase in the average grain size decreases the crystal grain boundary, spin-independent interface scattering of the conduction electrons can be decreased.

In addition, a columnar crystal is preferably formed, in which a crystal grain boundary formed in the fourth magnetic sublayer 31c, the crystal grain boundary appearing in a cut surface in the direction parallel to the thickness of the fourth magnetic sublayer 31c, and a crystal grain boundary formed in the Heusler alloy sublayer 31d are continuous. In this case, spin-independent scattering of the conduction electrons at the grain boundary can be decreased, thus increasing the ratio of change in magnetoresistance.

Furthermore, a columnar crystal is preferably formed, in which a crystal grain boundary formed in the nonmagnetic layer 15, the crystal grain boundary appearing in a cut surface in the direction parallel to the thickness of the nonmagnetic layer 15, and a crystal grain boundary formed in the Heusler alloy sublayer 32a are continuous. In this case, spin-independent scattering of the conduction electrons at the grain boundary can be decreased, thus increasing the ratio of change in magnetoresistance.

In particular, in the columnar crystal, the crystals of the fourth magnetic sublayer 31c are preferably matched with the crystals of the Heusler alloy sublayer 31d in a heteroepitaxial state. In the columnar crystal, the crystals of the nonmagnetic layer is are preferably matched with the crystals of the Heusler alloy sublayer 32a in a heteroepitaxial state.

In order to increase the antiferromagnetic exchange coupling magnetic fields (RKKY interaction) through the nonmagnetic interlayers 31b and 32c, the pinned magnetic layers 31 and 32 shown in FIG. 2 have the following structure: The nonmagnetic interlayer 31b is sandwiched between the third magnetic sublayer 31a and the fourth magnetic sublayer 31c, both of which are composed of CoFe, and the nonmagnetic interlayer 32c is sandwiched between the first magnetic sublayer 32b and the second magnetic sublayer 32d, both of which are composed of CoFe. Alternatively, the Heusler alloy sublayer 31d may be directly formed on the nonmagnetic interlayer 31b without forming the fourth magnetic sublayer 31c. The nonmagnetic interlayer 32c may be directly formed on the Heusler alloy sublayer 32a without forming the first magnetic sublayer 32b.

The Heusler alloy sublayer 31d may be disposed under the nonmagnetic interlayer 31b, and the Heusler alloy sublayer 32a may be disposed on the nonmagnetic interlayer 32c. However, since a layer being in contact with the nonmagnetic layer 15 affects the magnetoresistance effect, the Heusler alloy sublayer 31d is preferably disposed on the nonmagnetic interlayer 31b, and the Heusler alloy sublayer 32a is preferably disposed under the nonmagnetic interlayer 32c.

Each of the pinned magnetic layers 31 and 32 may include a single Heusler alloy sublayer or may have a laminated structure including a Heusler alloy sublayer and a magnetic sublayer, which does not have the synthetic ferrimagnetic structure.

In the magnetic sensing element shown in FIG. 2, the free magnetic layer 16 corresponds to the Heusler alloy layer of the present invention and the nonmagnetic layer 15 disposed under the free magnetic layer 16 corresponds to the fcc layer of the present invention. Accordingly, this magnetic sensing element also has the same advantages as the laminated structure including the free magnetic layer 16 and the nonmagnetic layer 15 in the magnetic sensing element shown in FIG. 1.

The pinned magnetic layer 31 shown in FIG. 2 may be used in the magnetic sensing element shown in FIG. 1 instead of the pinned magnetic layer 14.

Third Embodiment

Figure 3:
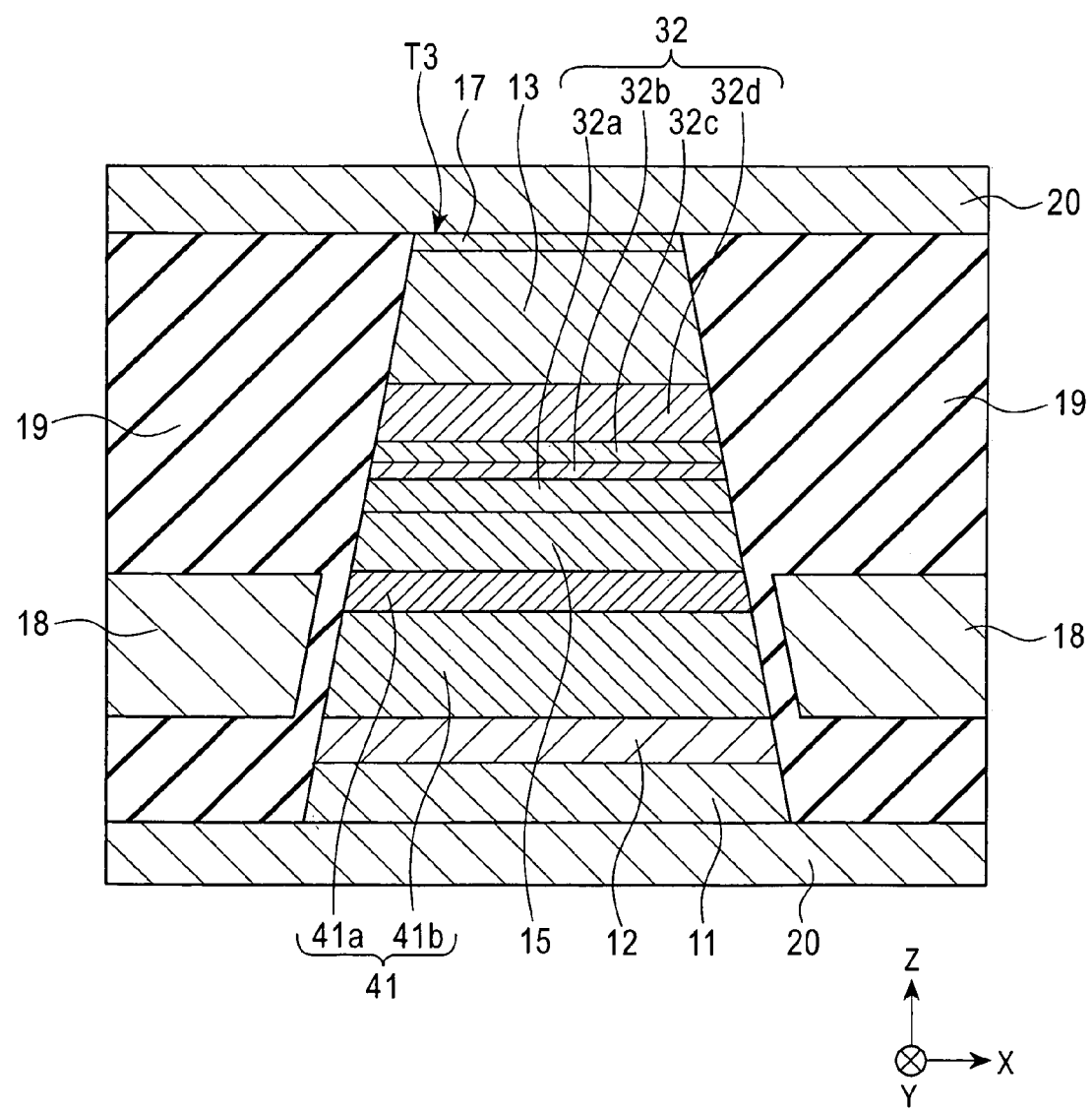
FIG. 3 is a cross-sectional view of the structure of a magnetic sensing element (single spin-valve magnetoresistive element) according to a third embodiment of the present invention, viewed from a surface facing a recording medium.

FIG. 3 is a partial cross-sectional view showing a structure of a top spin-valve magnetic sensing element according to a third embodiment of the present invention.

Referring to FIG. 3, from the bottom, a base layer 11, a seed layer 12, a free magnetic layer 41, a nonmagnetic layer 15, a pinned magnetic layer 32, an antiferromagnetic layer 13, and a protective layer 17 are sequentially deposited to form a multilayer film T3.

Hard bias layers 18 are disposed at each end of the free magnetic layer 41. The hard bias layers 18 are insulated by an insulating layer 19 composed of, for example, alumina.

Electrode layers 20 are disposed on and under the multilayer film T3. The magnetic sensing element of the present embodiment is a CPP-GMR magnetic sensing element in which a sense current flows in the direction perpendicular to the surface of each layer of the multilayer film T3.

In FIG. 3, layers having the same reference numeral as in FIG. 1 or FIG. 2 are composed of the same materials as those in FIG. 1 or FIG. 2.

In the magnetic sensing element shown in FIG. 3, the free magnetic layer 41 has a bilayer structure including a fifth magnetic sublayer 41a composed of NiFe and a sixth magnetic sublayer 41b composed of CoFe. This free magnetic layer 41 is disposed on the seed layer 12 composed of NiFeCr or Cr.

The seed layer 12 composed of NiFeCr has the fcc structure, in which equivalent crystal planes represented as [111] planes are preferentially oriented in the direction parallel to the layer surface. The seed layer 12 composed of Cr has the bcc structure, in which equivalent crystal planes represented as [110] planes are preferentially oriented in the direction parallel to the layer surface.

Both the fifth magnetic sublayer 41a composed of NiFe and the sixth magnetic sublayer 41b composed of CoFe have the fcc structure, in which equivalent crystal planes represented as [111] planes are preferentially oriented in the direction parallel to the layer surface.

The base layer 11 substantially has an amorphous structure. The formation of this base layer 11 is not essential.

According to the present embodiment, the structure and the materials of the pinned magnetic layer 32 are the same as those in the magnetic sensing element shown in FIG. 2. The pinned magnetic layer 32 has a quadruple layer structure including a Heusler alloy sublayer 32a, a first magnetic sublayer 32b, a nonmagnetic interlayer 32c, and a second magnetic sublayer 32d. The first magnetic sublayer 32b and the second magnetic sublayer 32d are composed of a ferromagnetic material having the fcc structure, for example, CoFe. The Heusler alloy sublayer 32a is composed of the same Heusler alloy as that of the Heusler alloy sublayer 32a in the above pinned magnetic layer 32. The first magnetic sublayer 32b is ferromagnetic, and the magnetization of the Heusler alloy sublayer 32a and that of the first magnetic sublayer 32b are directed in the same direction by the ferromagnetic coupling.

The nonmagnetic layer 15 is composed of Cu and corresponds to the fcc layer of the present invention. This nonmagnetic layer 15 has the fcc structure, in which equivalent crystal planes represented as [111] planes are preferentially oriented in the direction parallel to the layer surface.

According to the present embodiment, the Heusler alloy sublayer 32a is disposed on the nonmagnetic layer 15, which corresponds to the fcc layer of the present invention. Therefore, the Heusler alloy sublayer 32a has a crystal structure of an adequate superlattice. As a result, interfacial diffusion between the Heusler alloy sublayer 32a and the nonmagnetic layer 15 can be minimized.

The Heusler alloy sublayer 32a has the bcc structure. In the Heusler alloy sublayer 32a, equivalent crystal planes represented as [220] planes, which are the closest packed planes, are preferentially oriented in the direction parallel to the layer surface. Therefore, the ratio of change in magnetoresistance of the magnetic sensing element is increased, thereby improving the detection sensitivity of the external magnetic field.

In the Heusler alloy sublayer 32a, the average grain size in the direction parallel to the layer surface is preferably at least about 50 Å, and more preferably, at least about 100 Å. Since the increase in the average grain size decreases the crystal grain boundary, spin-independent scattering of the conduction electrons at the grain boundary can be decreased.

A columnar crystal is preferably formed, in which a crystal grain boundary formed in the nonmagnetic layer 15, the crystal grain boundary appearing in a cut surface in the direction parallel to the thickness of the nonmagnetic layer 15, and a crystal grain boundary formed in the Heusler alloy sublayer 32a are continuous. In this case, spin-independent interface scattering of the conduction electrons can be decreased, thus increasing the ratio of change in magnetoresistance.

In particular, in the columnar crystal, the crystals of the nonmagnetic layer 15 are preferably matched with the crystals of the Heusler alloy sublayer 32a in a heteroepitaxial state.

Fourth Embodiment

Figure 4:
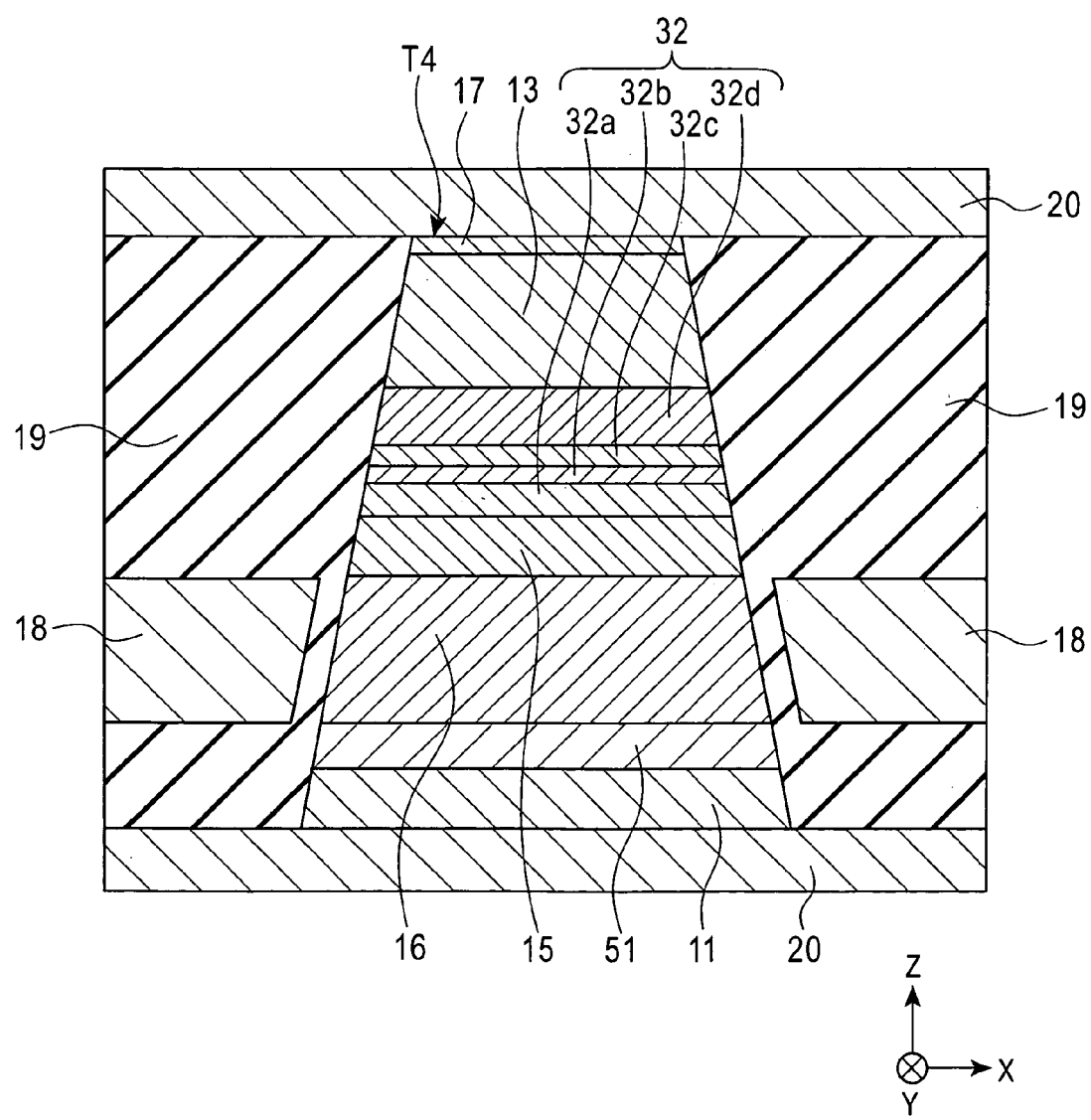
FIG. 4 is a cross-sectional view of the structure of a magnetic sensing element (single spin-valve magnetoresistive element) according to a fourth embodiment of the present invention, viewed from a surface facing a recording medium.

FIG. 4 is a partial cross-sectional view showing a structure of a top spin-valve magnetic sensing element according to a fourth embodiment of the present invention.

Referring to FIG. 4, from the bottom, a base layer 11, a seed layer 51, a free magnetic layer 16, a nonmagnetic layer 15, a pinned magnetic layer 32, an antiferromagnetic layer 13, and a protective layer 17 are sequentially deposited to form a multilayer film T4.

Hard bias layers 18 are disposed at each end of the free magnetic layer 16. The hard bias layers 18 are insulated by an insulating layer 19 composed of, for example, alumina.

Electrode layers 20 are disposed on and under the multilayer film T4. The magnetic sensing element of the present embodiment is a CPP-GMR magnetic sensing element in which a sense current flows in the direction perpendicular to the surface of each layer of the multilayer film T4.

In FIG. 4, layers having the same reference numeral as in FIG. 1 or FIG. 2 are composed of the same materials as those in FIG. 1 or FIG. 2.

In the magnetic sensing element shown in FIG. 4, the free magnetic layer 16 is the same Heusler alloy layer as that in the free magnetic layers 16 shown in FIGS. 1 and 2. This free magnetic layer 16 is disposed on the seed layer 51 composed of NiFeCr.

The seed layer 51 composed of NiFeCr and corresponds to the fcc layer of the present invention. The seed layer 51 has the fcc structure, in which equivalent crystal planes represented as [111] planes are preferentially oriented in the direction parallel to the layer surface.

The base layer 11 substantially has an amorphous structure. The formation of this base layer 11 is not essential.

According to the present embodiment, the structure and the materials of the pinned magnetic layer 32 are also the same as those in the magnetic sensing element shown in FIG. 2. The pinned magnetic layer 32 has a quadruple layer structure including a Heusler alloy sublayer 32a, a first magnetic sublayer 32b, a nonmagnetic interlayer 32c, and a second magnetic sublayer 32d. The first magnetic sublayer 32b and the second magnetic sublayer 32d are composed of a ferromagnetic material having the fcc structure, for example, CoFe. The Heusler alloy sublayer 32a is composed of the same Heusler alloy as that of the Heusler alloy sublayer 32a in the above pinned magnetic layer 32. The first magnetic sublayer 32b is ferromagnetic, and the magnetization of the Heusler alloy sublayer 32a and that of the first magnetic sublayer 32b are directed in the same direction by the ferromagnetic coupling.

The nonmagnetic layer 15 is composed of Cu and corresponds to the fcc layer of the present invention. This nonmagnetic layer 15 has the fcc structure, in which equivalent crystal planes represented as [111] planes are preferentially oriented in the direction parallel to the layer surface.

According to the present embodiment, the free magnetic layer 16 is disposed on the seed layer 51, which corresponds to the fcc layer of the present invention. In addition, the Heusler alloy sublayer 32a in the pinned magnetic layer 32 is disposed on the nonmagnetic layer 15, which corresponds to the fcc layer of the present invention. Therefore, the free magnetic layer 16 and the Heusler alloy sublayer 32a have a crystal structure of an adequate superlattice. As a result, interfacial diffusion between the free magnetic layer 16 and the seed layer 51, and interfacial diffusion between the Heusler alloy sublayer 32a and the nonmagnetic layer 15 can be minimized.

The free magnetic layer 16 and the Heusler alloy sublayer 32a have the bcc structure. In the free magnetic layer 16 and the Heusler alloy sublayer 32a, equivalent crystal planes represented as [220] planes, which are the closest packed planes, are preferentially oriented in the direction parallel to the layer surface. Therefore, the ratio of change in magnetoresistance of the magnetic sensing element is increased, thereby improving the detection sensitivity of the external magnetic field.

In the free magnetic layer 16 and the Heusler alloy sublayer 32a, the average grain size in the direction parallel to the layer surface is preferably at least about 50 Å, and more preferably, at least about 100 Å. Since the increase in the average grain size decreases the crystal grain boundary, spin-independent scattering of the conduction electrons at the grain boundary can be decreased.

A columnar crystal is preferably formed, in which a crystal grain boundary formed in the seed layer 51, the crystal grain boundary appearing in a cut surface in the direction parallel to the thickness of the seed layer 51, and a crystal grain boundary formed in the free magnetic layer 16 are continuous. In this case, interface scattering of the conduction electrons can be decreased and the parasitic resistance is decreased. Consequently, the ratio of change in magnetoresistance is increased.

In particular, in the columnar crystal, the crystals of the seed layer 51 are preferably matched with the crystals of free magnetic layer 16 in a heteroepitaxial state.

A columnar crystal is preferably formed, in which a crystal grain boundary formed in the nonmagnetic layer 15, the crystal grain boundary appearing in a cut surface in the direction parallel to the thickness of the nonmagnetic layer 15, and a crystal grain boundary formed in the Heusler alloy sublayer 32a are continuous. In this case, spin-independent interface scattering of the conduction electrons can be decreased, thus increasing the ratio of change in magnetoresistance.

In particular, in the columnar crystal, the crystals of the nonmagnetic layer 15 are preferably matched with the crystals of the Heusler alloy sublayer 32a in a heteroepitaxial state.

Preferably, the Heusler alloy layer (hereinafter, the term "Heusler alloy layer" also includes the Heusler alloy sublayer) (i.e., the free magnetic layer 16, the Heusler alloy sublayer 31d in the pinned magnetic layer 31, or the Heusler alloy sublayer 32a in the pinned magnetic layer 32) is deposited on the fcc layer (i.e., the nonmagnetic layer 15, the fourth magnetic sublayer 31c in the pinned magnetic layer 31, or the seed layer 51) such that the Heusler alloy layer is matched with the fcc layer in an epitaxial or a heteroepitaxial state. In order to achieve this, atoms of the Heusler alloy layer must have energy for adequately moving on the fcc layer so that after reaching the fcc layer, the atoms sputtered from a target substrate, which are the material of the Heusler alloy layer, can be rearranged according to the atomic arrangement of the fcc layer.

In order to increase the energy of the atoms of the Heusler alloy layer, optimizing the sputtering gas pressure to sputter the target is important. An excessively high sputtering gas pressure increases collision frequency between the atoms of the Heusler alloy layer and the sputtering gas molecules. Consequently, the atoms, which become the material of the Heusler alloy layer, lose their energy before reaching the fcc layer. Therefore, the sputtering gas pressure is preferably low, but an excessively low sputtering gas pressure prevents stable electrical discharge.

Accordingly, the sputtering gas pressure to sputter the target is preferably about $5 \times 10^{-5}$ Torr ($6.7 \times 10^{-3}$ Pa) to about $3 \times 10^{-3}$ Torr (0.4 Pa). In preparation of the magnetic sensing element of the present embodiment, argon is used as the sputtering gas with a sputtering gas pressure of about $1.5 \times 10^{-3}$ Torr (0.2 Pa).

When the temperature of a substrate having the fcc layer thereon is increased, the atoms of the Heusler alloy layer sputtered on the fcc layer from the target readily move on the fcc layer and are readily rearranged according to the atomic arrangement of the fcc layer. However, an excessively high temperature of the substrate having the fcc layer is not preferable because interdiffusion of the atoms at the interface between the fcc layer and the Heusler alloy layer occurs to a significant degree.

Accordingly, the temperature of the substrate having the fcc layer is preferably from about 0° C. to about 100° C. In preparation of the magnetic sensing element of the present embodiment, the temperature of the substrate is kept at about 30° C. to about 40° C. by water-cooling.

When reaching the fcc layer, the atoms of the Heusler alloy layer preferably have a large amount of energy. In order to increase the energy, the distance between the target and the substrate having the fcc layer is preferably small so as to decrease the collision frequency between the atoms of the Heusler alloy layer and the sputtering gas molecules. However, an excessively small distance between the target and the substrate having the fcc layer is not preferable. The temperature of the substrate having the fcc layer is excessively increased by secondary electrons from the target and radiation heat, and consequently, interdiffusion of the atoms at the interface between the fcc layer and the Heusler alloy layer occurs to a significant degree. Furthermore, in an excessively small distance between the target and the substrate having the fcc layer, it is difficult to deposit the Heusler alloy layer having a uniform thickness.

Accordingly, the distance between the target and the substrate having the fcc layer is preferably from about 50 to about 300 mm. In preparation of the magnetic sensing element of the present embodiment, the distance between the target and the substrate having the fcc layer is about 89 mm.

EXAMPLES

Example 1

CPP-GMR magnetic sensing elements (bottom spin-valves) having the following layer structures were formed. Values represented by resistance×area of element, i.e., ReA (mΩμm$^2$), amount of change in resistance×area of element, i.e., ΔRA (mΩμm$^2$), and the ratio of change in resistance, i.e., ΔR/Re (%) were then measured.

Comparative Sample 1: base layer (Ta (30 Å))/seed layer (($Ni_{0.8}Fe_{0.2})_{60}Cr_{40}$(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Ni_{80}Fe_{20}$(35 Å)/$Co_{90}Fe_{10}$(5 Å))/nonmagnetic layer (Cu(43 Å))/free magnetic layer ($Co_{90}Fe_{10}$(5 Å)/$Ni_{80}Fe_{20}$(90 Å)/$Co_{90}Fe_{10}$(5 Å))/protective layer (Ta(30 Å)).

Comparative Sample 2: base layer (Ta (30 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnGe$ (40 Å))/nonmagnetic layer (Cu(43 Å))/free magnetic layer ($Co_2MnGe$(60 Å))/protective layer (Ta(30 Å)).

Sample 1: base layer (Ta(30 Å))/seed layer (($Ni_{0.8}Fe_{0.2}$)$_{60}Cr_{40}$(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnGe$(40 Å))/nonmagnetic layer (Cu (43 Å))/free magnetic layer ($Co_2MnGe$(60 Å))/protective layer (Ta(30 Å)).

Sample 2: base layer (Ta(30 Å))/seed layer (Cr(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnGe$ (40 Å))/nonmagnetic layer (Cu(43 Å))/free magnetic layer ($Co_2MnGe$(60 Å))/protective layer (Ta(30 Å)).

Values in parentheses of the layers represent the layer thickness.

Referring to Samples 1 and 2, in the pinned magnetic layer, the Heusler alloy sublayer composed of $Co_2MnGe$ was deposited on the fcc layer composed of $Co_{90}Fe_{10}$. The free magnetic layer was a Heusler alloy layer composed of $Co_2MnGe$. The free magnetic layer was deposited on the nonmagnetic layer composed of Cu, which was an fcc layer.

Table 1 shows the results.

TABLE 1

| | SV type | Pin 2 (Å) | Free (Å) | Base/Seed (Å) | ReA (mΩμm²) | ΔRA (mΩμm²) | ΔR/Re (%) |
|---|---|---|---|---|---|---|---|
| Comparative Sample 1 | Bottom | $Co_{90}Fe_{10}$(10)/ $Ni_{80}Fe_{20}$(35)/ $Co_{90}Fe_{10}$(5) | $Co_{90}Fe_{10}$(5)/ $Ni_{80}Fe_{20}$(90)/ $Co_{90}Fe_{10}$(5) | Ta(30)/NiFeCr(60) | 82 | 1.19 | 1.45 |
| Comparative Sample 2 | Bottom | $Co_{90}Fe_{10}$(10)/ $Co_2MnGe$(40) | $Co_2MnGe$(60) | Ta(30) | 98 | 0.16 | 0.16 |
| Sample 1 | Bottom | $Co_{90}Fe_{10}$(10)/ $Co_2MnGe$(40) | $Co_2MnGe$(60) | Ta(30)/NiFeCr(60) | 90 | 4.12 | 4.58 |
| Sample 2 | Bottom | $Co_{90}Fe_{10}$(10)/ $Co_2MnGe$(40) | $Co_2MnGe$(60) | Ta(30)/Cr(60) | 87 | 3.91 | 4.49 |

In Comparative Sample 1, Comparative Sample 2, Sample 1, and Sample 2, the value represented by resistance×area of element ReA (mΩμm²) in the magnetic sensing element was in the range of about 80 to about 100 mΩμm². The use of the Heusler alloy $Co^2MnGe$ as the free magnetic layer and the pinned magnetic layer increased the value represented by resistance×area of element ReA (mΩμm²).

Regarding the value represented by the amount of change in resistance×area of element ΔRA (mΩμm²), there was a significant difference between the Comparative Samples and the Samples. In Samples 1 and 2, the Heusler alloy $Co_2MnGe$ was used as the free magnetic layer and the pinned magnetic layer, and was deposited on the fcc layers ($Co_{90}Fe_{10}$ and Cu). This layer structure provided the amount of change in resistance ΔRA (mΩμm²) more than three times as high as that of the magnetic sensing elements in the above Comparative Samples.

In Comparative Sample 2, the sublayer composed of $Co_2MnGe$ (40 Å) was deposited on the sublayer composed of $Co_{90}Fe_{10}$ (10 Å) in the pinned magnetic layer, and the free magnetic layer composed of $Co_2MnGe$ was deposited on the nonmagnetic layer composed of Cu. In this Comparative Sample 2, however, the value of ΔRA was low. This is because the sublayer composed of $Co_{90}Fe_{10}$ and the nonmagnetic layer composed of Cu are in a non-orientation state and do not have the [111]-oriented structure.

In Samples 1 and 2, as a result of large amount of change in resistance ΔRA (mΩμm²), the ratio of change in resistance ΔR/Re (%) was more than three times as high as that in the Comparative Samples.

When the seed layer, which is disposed under the antiferromagnetic layer, is composed of NiFeCr, this seed layer has the face-centered cubic (fcc) structure, in which equivalent crystal planes represented as [111] planes are preferentially oriented in the direction parallel to the layer surface. When the seed layer is composed of Cr, this seed layer has the body-centered cubic (bcc) structure, in which equivalent crystal planes represented as [110] planes are preferentially oriented in the direction parallel to the layer surface.

In the magnetic sensing element in Sample 1 having the seed layer composed of NiFeCr, the amount of change in resistance ΔRA (mΩμm²) and the ratio of change in resistance ΔR/Re (%) were higher than those of the magnetic sensing element in Sample 2 having the seed layer composed of Cr.

Magnetic sensing elements using $Co_2MnSi$ instead of $Co_2MnGe$ used in the above Samples showed the same results.

Example 2

CPP-GMR magnetic sensing elements (top spin-valves) having the following layer structures were formed. Values represented by resistance×area of element, i.e., ReA (mΩμm²), amount of change in resistance×area of element, i.e., ΔRA (mΩμm²), and the ratio of change in resistance, i.e., ΔR/Re (%) were then measured.

Comparative Sample 3: base layer (Ta(30 Å))/seed layer (($Ni_{0.8}Fe_{0.2}$)$_{60}Cr_{40}$(60 Å))/free magnetic layer ($Co_{90}Fe_{10}$(5 Å)/$Ni_{80}Fe_{20}$(90 Å)/$Co_{90}Fe_{10}$(5 Å))/nonmagnetic layer (Cu (43 Å))/pinned magnetic layer ($Co_{90}Fe_{10}$(10 Å)/$Ni_{80}Fe_{20}$(35 Å)/$Co_{90}Fe_{10}$(5 Å)/Ru(9 Å)/($Co_{90}Fe_{10}$(30 Å)/antiferromagnetic layer ($Pt_{50}Mn_{50}$(170 Å))/protective layer (Ta(30 Å)).

Comparative Sample 4: base layer (Ta(30 Å))/free magnetic layer ($Co_2MnGe$(60 Å))/nonmagnetic layer (Cu(43 Å))/pinned magnetic layer ($Co_2MnGe$(40 Å)/($Co_{90}Fe_{10}$(10 Å)/Ru(9 Å)/$Co_{90}Fe_{10}$(30 Å))/antiferromagnetic layer ($Pt_{50}Mn_{50}$(170 Å))/protective layer (Ta(30 Å)).

Sample 3: base layer (Ta(30 Å))/seed layer (($Ni_{0.8}Fe_{0.2}$)$_{60}Cr_{40}$ (60 Å))/free magnetic layer ($Co_2MnGe$(60 Å))/nonmagnetic layer (Cu(43 Å))/pinned magnetic layer ($Co_2MnGe$(40 Å)/$CO_{90}Fe_{10}$(10 Å)/Ru(9 Å)/($Co_{90}Fe_{10}$(30 Å))/antiferromagnetic layer ($Pt_{50}Mn_{50}$(170 Å))/protective layer (Ta(30 Å)).

Values in parentheses of the layers represent the layer thickness.

Referring to Sample 3, in the pinned magnetic layer, the Heusler alloy sublayer composed of $Co_2MnGe$ was deposited on the nonmagnetic layer composed of Cu, which was an fcc layer. The free magnetic layer was a Heusler alloy layer composed of $Co_2MnGe$. The free magnetic layer was deposited on the seed layer composed of NiFeCr, which was an fcc layer.

Table 2 shows the results.

TABLE 2

|  | SV type | Pin 2 (Å) | Free (Å) | Base/Seed (Å) | ReA (mΩμm²) | ΔRA (mΩμm²) | ΔR/Re (%) |
|---|---|---|---|---|---|---|---|
| Comparative Sample 3 | Top | $Co_{90}Fe_{10}(10)$/ $Ni_{80}Fe_{20}(35)$/ $Co_{90}Fe_{10}(5)$ | $Co_{90}Fe_{10}(5)$/ $Ni_{80}Fe_{20}(90)$/ $Co_{90}Fe_{10}(5)$ | Ta(30)/NiFeCr(60) | 80 | 1.10 | 1.38 |
| Comparative Sample 4 | Top | $Co_2MnGe(40)$/ $Co_{90}Fe_{10}(10)$ | $Co_2MnGe(60)$ | Ta(30) | 95 | 0.14 | 0.15 |
| Sample 3 | Top | $Co_2MnGe(40)$/ $Co_{90}Fe_{10}(10)$ | $Co_2MnGe(60)$ | Ta(30)/NiFeCr(60) | 88 | 3.88 | 4.41 |

In Comparative Sample 3, Comparative Sample 4, and Sample 3, the value represented by resistance×area of element ReA (mΩμm²) in the magnetic sensing element was in the range of 80 to 95 mΩμm². The use of the Heusler alloy $Co_2MnGe$ as the free magnetic layer and the pinned magnetic layer increased the value represented by resistance×area of element ReA (mΩμm²).

Regarding the value represented by the amount of change in resistance×area of element ΔRA (mΩμm²), there was a significant difference between the Comparative Samples and Sample 3. In Sample 3, the Heusler alloy $Co_2MnGe$ was used as the free magnetic layer and the pinned magnetic layer, and was deposited on the fcc layers (the seed layer composed of NiFeCr and the nonmagnetic layer composed of Cu). This layer structure provided the amount of change in resistance ΔRA (mΩμm²) more than three times as high as that of the magnetic sensing elements in the above Comparative Samples.

In Comparative Sample 4, the free magnetic layer composed of $Co_2MnGe$ was deposited on the base layer composed of Ta, and the sublayer composed of $Co_2MnGe$ in the pinned magnetic layer was deposited on the nonmagnetic layer composed of Cu. In this Comparative Sample 4, however, the value of ΔRA was low. This is because the base layer composed of Ta and the nonmagnetic layer composed of Cu are in a non-orientation state and do not have the [111]-oriented structure.

In Sample 3, as a result of large amount of change in resistance ΔRA (mΩμm²), the ratio of change in resistance ΔR/Re (%) was more than three times as high as that in the above Comparative Samples.

A magnetic sensing element using $Co_2MnSi$ instead of $Co_2MnGe$ used in the above Sample showed the same results.

Example 3

CPP-GMR magnetic sensing elements (dual spin-valves) having the following layer structures were formed. Values represented by resistance×area of element, i.e., ReA (mΩμm²), amount of change in resistance×area of element, i.e., ΔRA (mΩμm²), and the ratio of change in resistance, i.e., ΔR/Re (%) were then measured.

Comparative Sample 5: base layer (Ta(30 Å))/seed layer (($Ni_{0.8}Fe_{0.2})_{60}Cr_{40}$(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Ni_{80}Fe_{20}$(35 Å)/$Co_{90}Fe_{10}$(5 Å))/nonmagnetic layer(Cu(43 Å))/free magnetic layer ($Co_{90}Fe_{10}$(5 Å)/$Ni_{80}Fe_{20}$ (90 Å)/$Co_{90}Fe_{10}$(5 Å))/nonmagnetic layer (Cu(43 Å))/pinned magnetic layer ($Co_{90}Fe_{10}$(10 Å)/$Ni_{80}Fe_{20}$(35 Å)/$Co_{90}Fe_{10}$(5 Å)/Ru(9 Å)/($Co_{90}Fe_{10}$(30 Å)/antiferromagnetic layer ($Pt_{50}Mn_{50}$(170 Å))/protective layer (Ta(30 Å)).

Comparative Sample 6: base layer (Ta(30 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnSi$(40 Å))/nonmagnetic layer (Cu(43 Å))/free magnetic layer ($Co_2MnSi$(60 Å))/nonmagnetic layer (Cu(43 Å))/pinned magnetic layer ($Co_2MnSi$(40 Å)/($Co_{90}Fe_{10}$(10 Å)/Ru(9 Å)/$Co_{90}Fe_{10}$(30 Å))/antiferromagnetic layer ($Pt_{50}Mn_{50}$(170 Å))/protective layer (Ta(30 Å)).

Sample 4: base layer (Ta(30 Å))/seed layer (($Ni_{0.8}Fe_{0.2})_{60}Cr_{40}$(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnSi$(40 Å))/nonmagnetic layer (Cu (43 Å)/free magnetic layer ($Co_2MnSi$(60 Å))/nonmagnetic layer (Cu(43 Å))/pinned magnetic layer ($Co_2MnSi$(40 Å)/$Co_{90}Fe_{10}$(10 Å)/Ru(9 Å)/($Co_{90}Fe_{10}$(30 Å))/antiferromagnetic layer ($Pt_{50}Mn_{50}$(170 Å))/protective layer (Ta(30 Å)).

Sample 5: base layer (Ta(30 Å))/seed layer (Cr(60 Å))/antiferromagnetic layer ($Pt_{50}Mn_{50}$(170 Å))/pinned magnetic layer ($Co_{90}Fe_{10}$(30 Å)/Ru(9 Å)/$Co_{90}Fe_{10}$(10 Å)/$Co_2MnSi$ (40 Å))/nonmagnetic layer (Cu(43 Å))/free magnetic layer ($Co_2MnSi$(60 Å))/nonmagnetic layer (Cu(43 Å))/pinned magnetic layer ($Co_2MnSi$(40 Å)/$Co_{90}Fe_{10}$(10 Å)/Ru(9 Å)/ ($Co_{90}Fe_{10}$(30 Å))/antiferromagnetic layer ($Pt_{50}Mn_{50}$(170 Å))/protective layer (Ta(30 Å)).

Values in parentheses of the layers represent the layer thickness.

Referring to Samples 4 and 5, in the lower pinned magnetic layer, the Heusler alloy sublayer composed of $Co_2MnSi$ was deposited on the fcc layer composed of $Co_{90}Fe_{10}$. The free magnetic layer was a Heusler alloy layer composed of $Co_2MnSi$. The free magnetic layer was deposited on the nonmagnetic layer composed of Cu, which was an fcc layer. Furthermore, in the upper pinned magnetic layer, the Heusler alloy sublayer composed of $Co_2MnSi$ was deposited on the nonmagnetic layer composed of Cu, which was an fcc layer.

Table 3 shows the results.

TABLE 3

|  | SV type | Pin 2 (Å) | Free (Å) | Base/Seed (Å) | ReA (mΩμm²) | ΔRA (mΩμm²) | ΔR/Re (%) |
|---|---|---|---|---|---|---|---|
| Comparative Sample 5 | Dual | $Co_{90}Fe_{10}(10)$/$Ni_{80}Fe_{20}(35)$/$Co_{90}Fe_{10}(5)$ | $Co_{90}Fe_{10}(5)$/$Ni_{80}Fe_{20}(90)$/$Co_{90}Fe_{10}(5)$ | Ta(30)/NiFeCr(60) | 122 | 2.42 | 1.98 |
| Comparative Sample 6 | Dual | $Co_{90}Fe_{10}(10)$/$Co_2MnSi(40)$ | $Co_2MnSi(60)$ | Ta(30) | 142 | 0.18 | 0.13 |
| Sample 4 | Dial | $Co_{90}Fe_{10}(10)$/$Co_2MnSi(40)$ | $Co_2MnSi(60)$ | Ta(30)/NiFeCr(60) | 128 | 6.88 | 5.38 |
| Sample 5 | Dual | $Co_{90}Fe_{10}(10)$/$Co_2MnSi(40)$ | $Co_2MnSi(60)$ | Ta(30)/Cr(60) | 124 | 6.75 | 5.44 |

In Comparative Sample 5, Comparative Sample 6, Sample 4, and Sample 5, the value represented by resistance×area of element ReA (mΩμm²) in the magnetic sensing element was in the range of about 120 to about 140 mΩμm². The use of the Heusler alloy $Co_2MnSi$ as the free magnetic layer and the pinned magnetic layer increased the value represented by resistance×area of element ReA (mΩμm²).

Regarding the value represented by the amount of change in resistance×area of element ΔRA (mΩμm²), there was a significant difference between the Comparative Samples and the Samples. In Samples 4 and 5, the Heusler alloy $Co_2MnSi$ was used as the free magnetic layer and the pinned magnetic layer, and was deposited on the fcc layers ($Co_{90}Fe_{10}$ and Cu). This layer structure provided the amount of change in resistance ΔRA (mΩμm²) more than 2.5 times as high as that of the magnetic sensing elements in the above Comparative Samples.

In Comparative Sample 6, the sublayer composed of $Co_2MnSi$(40 Å) was deposited on the sublayer composed of $Co_{90}Fe_{10}$(10 Å) in the lower pinned magnetic layer. The free magnetic layer composed of $Co_2MnSi$ was deposited on the nonmagnetic layer composed of Cu. In addition, the sublayer composed of $Co_2MnSi$ in the upper pinned magnetic layer was deposited on the nonmagnetic layer composed of Cu. In this Comparative Sample 6, however, the value of ΔRA was low. This is because the sublayer composed of $Co_{90}Fe_{10}$ and the nonmagnetic layers composed of Cu are in a non-orientation state and do not have the [111]-oriented structure. In Samples 4 and 5, as a result of large amount of change in resistance ΔRA (mΩμm²), the ratio of change in resistance ΔR/Re (%) was more than 2.5 times as high as that in the above Comparative Samples.

Magnetic sensing elements using $Co_2MnGe$ instead of $Co_2MnSi$ used in the above Samples showed the same results.

Example 4

Figure 7:
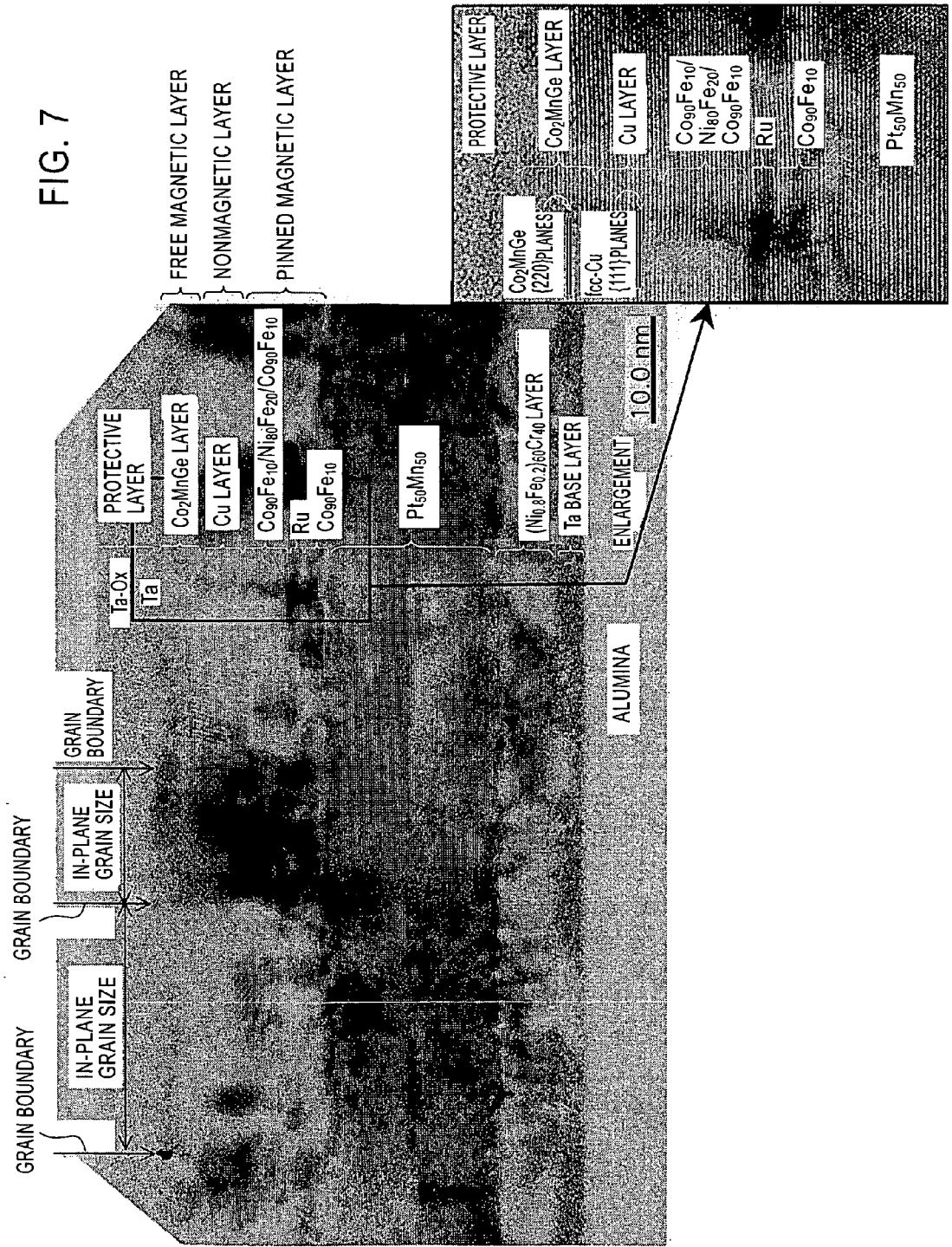
FIG. 7 shows transmission electron microscope images of a magnetic sensing element of the present invention.
Figure 8:
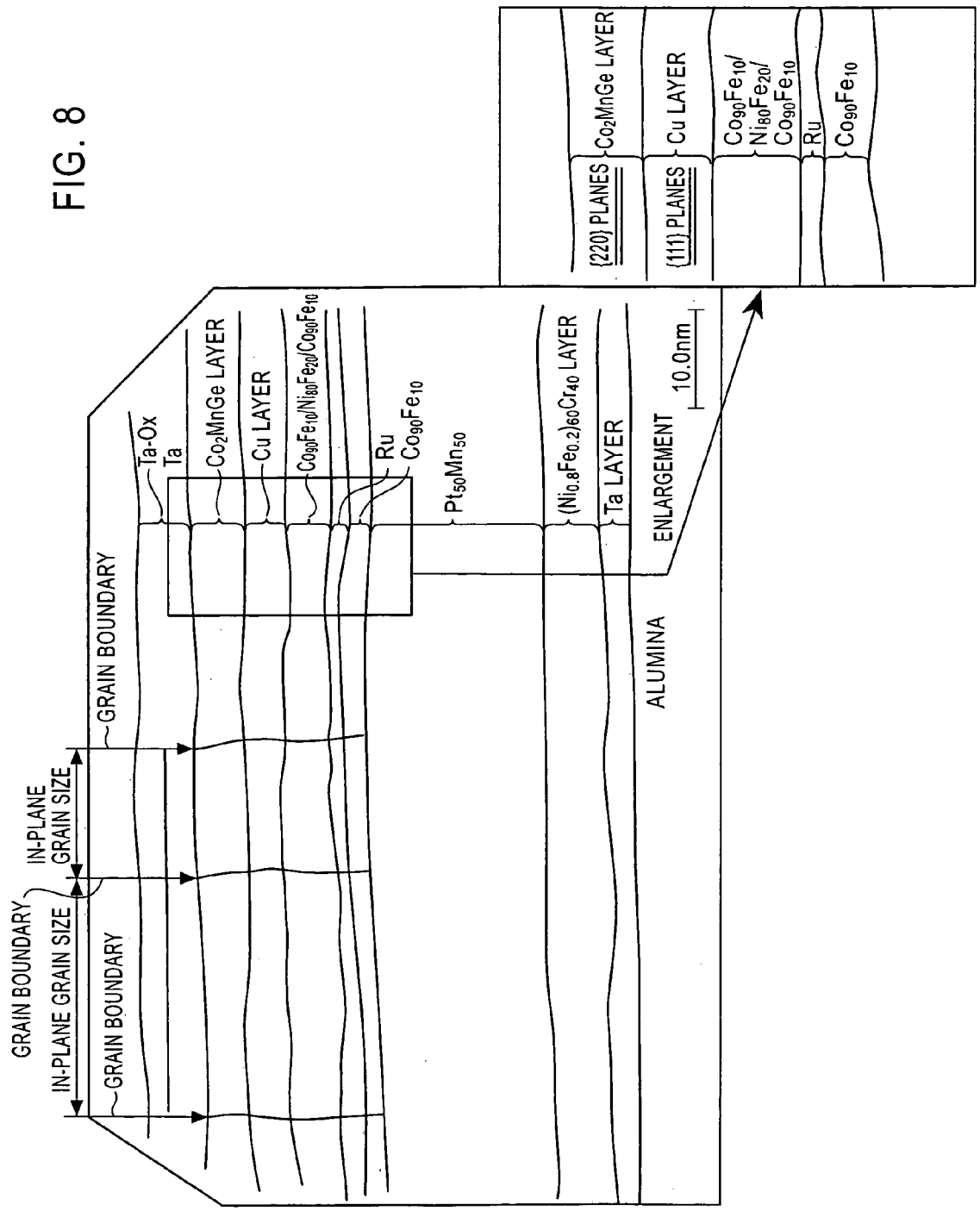
FIG. 8 shows schematic views of the images shown in FIG. 7.

FIG. 7 includes transmission electron microscope (TEM) images of a spin-valve film of the present invention, viewed from a cut surface in the direction parallel to the film thickness. FIG. 8 includes schematic views of the images shown in FIG. 7.

The layer structure was as follows.

Si substrate/$Al_2O_3$/base layer: Ta(30 Å)/seed layer: $(Ni_{0.8}Fe_{0.2})_{60}Cr_{40}$(60 Å)/antiferromagnetic layer: $Pt_{50}Mn_{50}$ (170 Å)/pinned magnetic layer: $CO_{90}Fe_{10}$(30 Å)/Ru(9 Å)/$CO_{90}Fe_{10}$(10 Å)/$Ni_{80}Fe_{20}$(35 Å)/$Co_{90}Fe_{10}$(5 Å)/nonmagnetic layer: Cu(43 Å)/free magnetic layer:($Co_2MnGe$ (40 Å)/Ta(30 Å).

In this Example, the nonmagnetic layer composed of Cu had the fcc structure, in which equivalent crystal planes represented as [111] planes were preferentially oriented in the direction parallel to the layer surface. This nonmagnetic layer corresponds to an fcc layer. The free magnetic layer composed of $Co_2MnGe$ corresponds to a Heusler alloy layer.

Referring to FIGS. 7 and 8, a columnar crystal was formed. In the columnar crystal, a crystal grain boundary formed in the nonmagnetic layer (fcc layer; Cu layer), the crystal grain boundary appearing in a cut surface in the direction parallel to the thickness of the nonmagnetic layer (fcc layer), and a crystal grain boundary formed in the free magnetic layer (Heusler alloy layer; $Co_2MnGe$ layer) were continuous.

In the free magnetic layer (Heusler alloy layer; $Co_2MnGe$ layer), the average grain size (i.e., the average of in-plane grain sizes in crystal grains shown in FIGS. 7 and 8) in the direction parallel to the layer surface is preferably at least 50 Å. In this Example, the average grain size was 190 Å.

The free magnetic layer (Heusler alloy layer; $Co_2MnGe$ layer) had the bcc structure, in which equivalent crystal planes represented as [220] planes were preferentially oriented in the direction parallel to the layer surface.

In addition, in the columnar crystal, the crystals of the nonmagnetic layer (Cu layer) were matched with the crystals of the free magnetic layer in a heteroepitaxial state.

The seed layer, i.e., the NiFeCr layer, had the fcc structure, in which [111] planes were preferentially oriented in the direction parallel to the layer surface. During deposition, the antiferromagnetic layer composed of PtMn had the fcc structure. After annealing, the crystal structure of the antiferromagnetic layer was changed to the face-centered tetragonal (fct) structure. In the pinned magnetic layer, the sublayers composed of $Co_{90}Fe_{10}$ and $Ni_{80}Fe_{20}$ had the fcc structure, in which [111] planes were preferentially oriented in the direction parallel to the layer surface. The interlayer composed of Ru had a hexagonal close-packed (hcp) structure, in which c planes, i.e., [0001] planes, were preferentially oriented in the direction parallel to the layer surface.

A spin-valve film using $Co_2MnSi$ instead of $Co_2MnGe$ used in the above Example showed the same results.

Example 5

Figure 9:
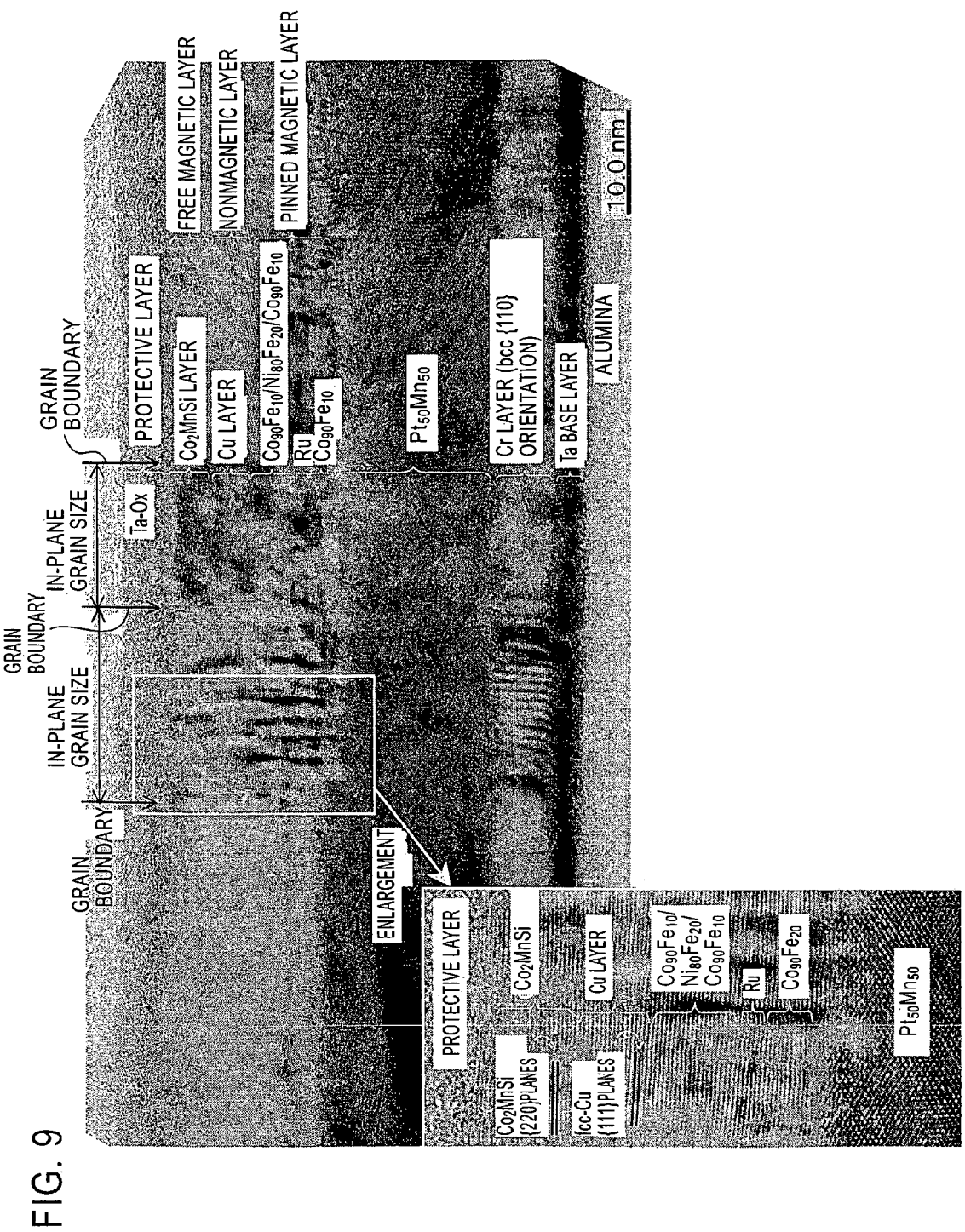
FIG. 9 shows transmission electron microscope images of a magnetic sensing element of the present invention.
Figure 10:
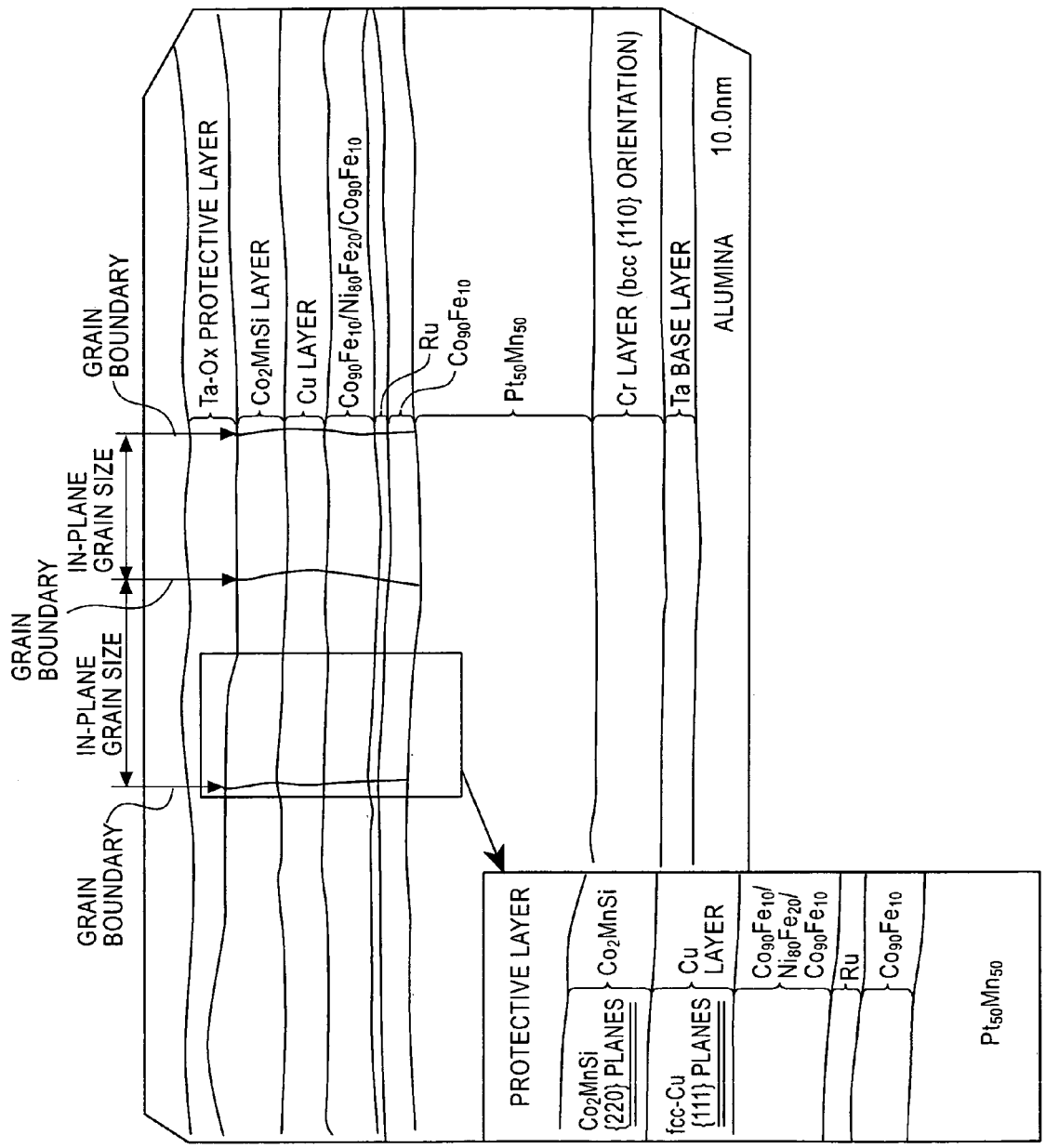
FIG. 10 shows schematic views of the images shown in FIG. 9.

FIG. 9 includes TEM images of a spin-valve film of the present invention; viewed from a cut surface in the direction parallel to the film thickness. FIG. 10 includes schematic views of the images shown in FIG. 9.

The layer structure was as follows. Si substrate/$Al_2O_3$/base layer: Ta(30 Å)/seed layer: Cr(60 Å)/antiferromagnetic layer: $Pt_{50}Mn_{50}$(170 Å)/pinned magnetic layer: $CO_{90}Fe_{10}$ (30 Å)/Ru(9 Å)/Co$_{90}$Fe$_{10}$(10 Å)/Ni$_{80}$Fe$_{20}$(35 Å)/Co$_{90}$Fe$_{10}$ (5 Å)/nonmagnetic layer: Cu (43 Å)/free magnetic layer: (Co$_2$MnSi (40 Å)/Ta (30 Å).

In this Example, the nonmagnetic layer (Cu layer) composed of Cu had the fcc structure, in which equivalent crystal planes represented as [111] planes were preferentially oriented in the direction parallel to the layer surface. This nonmagnetic layer corresponds to an fcc layer. The free magnetic layer composed of Co$_2$MnSi corresponds to a Heusler alloy layer (Co$_2$MnSi layer).

Referring to FIGS. 9 and 10, a columnar crystal was formed, in which a crystal grain boundary formed in the nonmagnetic layer (fcc layer; Cu layer), the crystal grain boundary appearing in a cut surface in the direction parallel to the thickness of the nonmagnetic layer (fcc layer; Cu layer), and a crystal grain boundary formed in the free magnetic layer (Heusler alloy layer; Co$_2$MnSi layer) were continuous.

In the free magnetic layer (Heusler alloy layer; Co$_2$MnSi layer), the average grain size (i.e., the average of in-plane grain sizes in crystal grains shown in FIGS. 9 and 10) in the direction parallel to the layer surface is preferably at least about 50 Å. In this Example, the average grain size was 200 Å.

The free magnetic layer (Heusler alloy layer; Co$_2$MnSi layer) had the bcc structure, in which equivalent crystal planes represented as [200] planes were preferentially oriented in the direction parallel to the layer surface.

In addition, in the columnar crystal, the crystals of the nonmagnetic layer (Cu layer) were matched with the crystals of the free magnetic layer (Heusler alloy layer; Co$_2$MnSi layer) in a heteroepitaxial state.

The seed layer composed of Cr had the bcc structure, in which [110] planes were preferentially oriented in the direction parallel to the layer surface. The orientations of the crystals in the antiferromagnetic layer and the pinned magnetic layer were the same as those in the antiferromagnetic layer and the pinned magnetic layer shown in FIGS. 7 and 8.

A spin-valve film using Co$_2$MnGe instead of Co$_2$MnSi used in the above Example showed the same results.

Example 6

Figure 11:
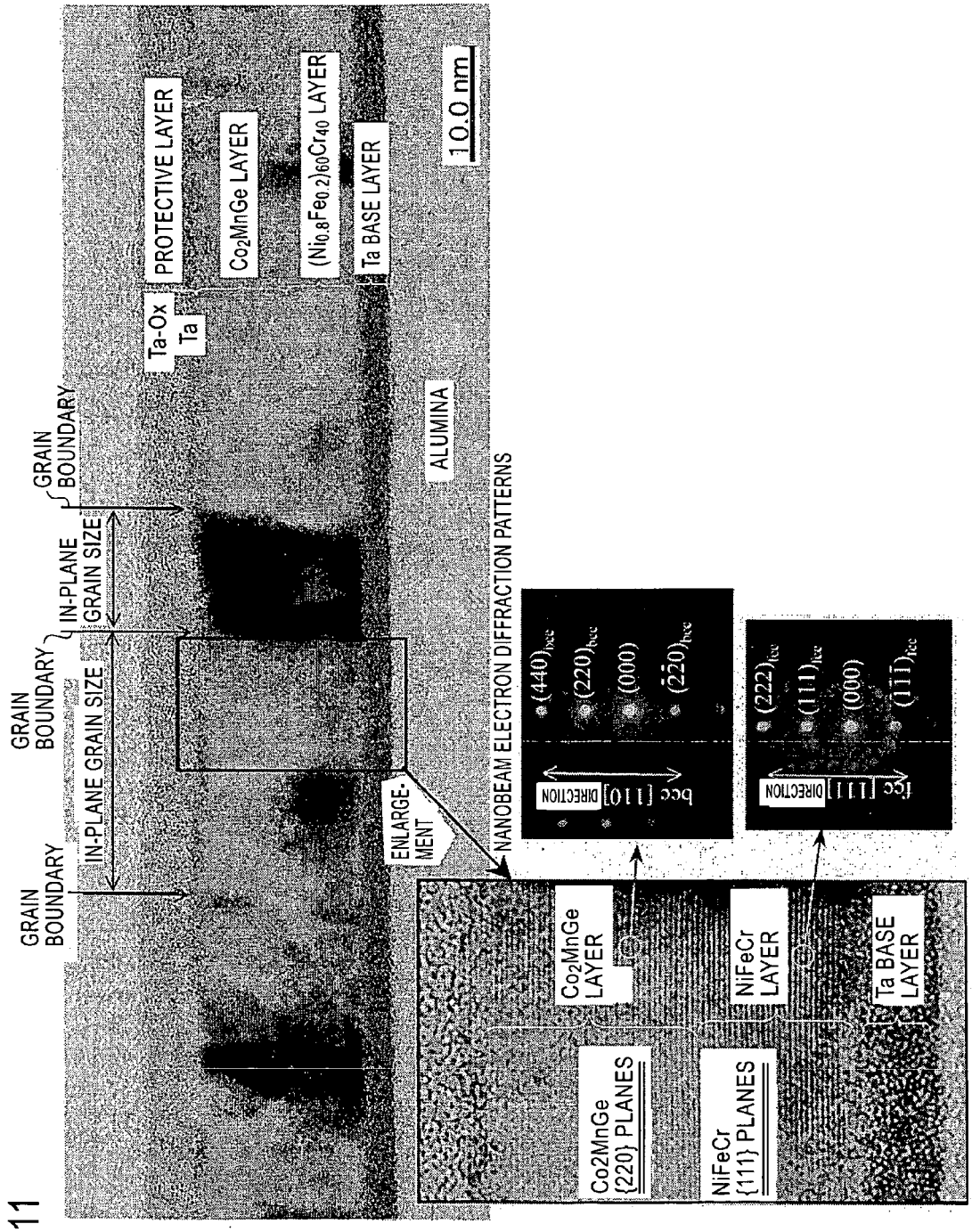
FIG. 11 shows transmission electron microscope images of a multilayer film including a Heusler alloy layer disposed on an fcc layer, and electron diffraction patterns of the fcc layer and the Heusler alloy layer.
Figure 12:
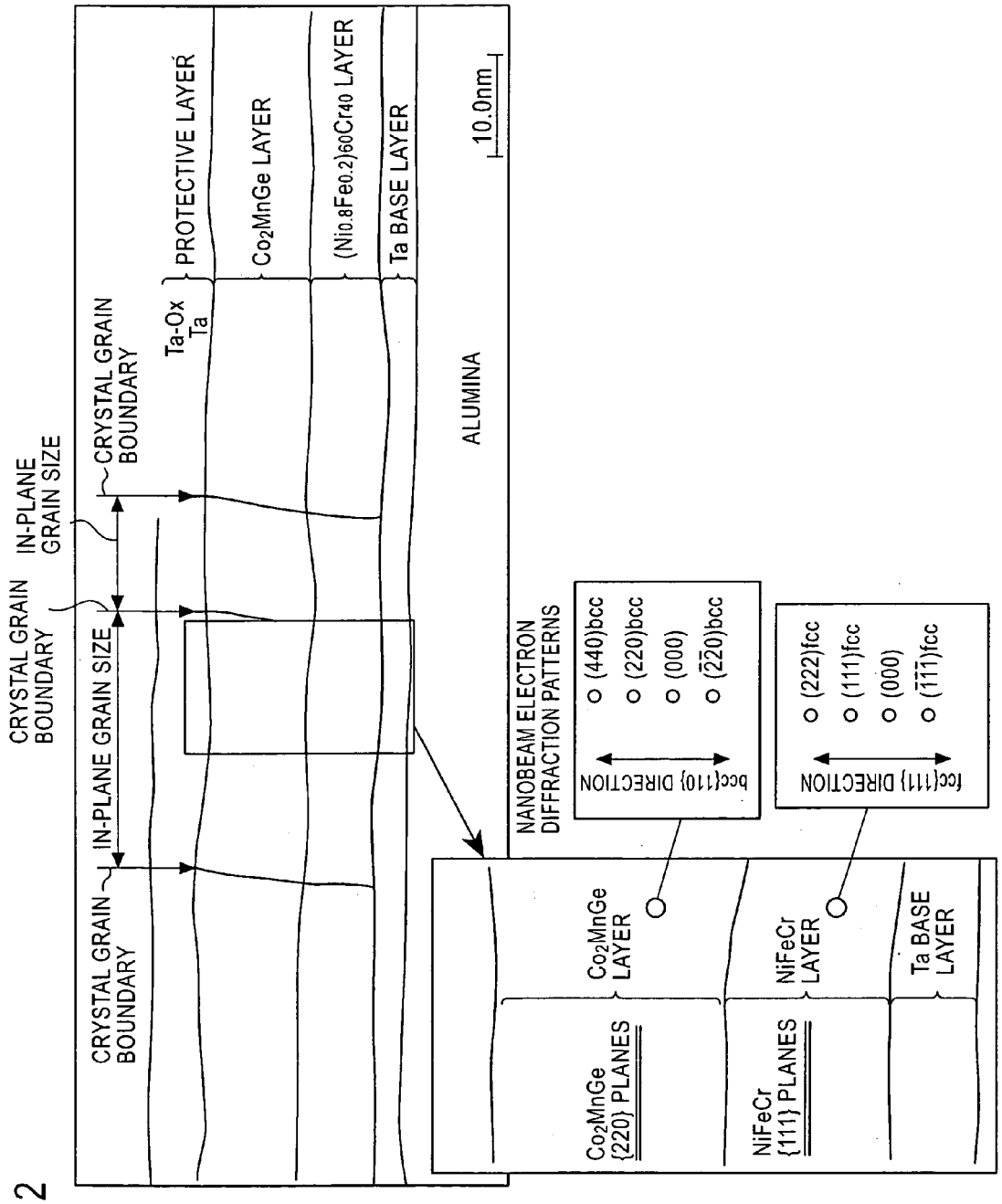
FIG. 12 shows schematic views of the images and patterns shown in FIG. 11.

FIG. 11 includes TEM images of a layered product of the present invention including an fcc layer ((Ni$_{0.8}$Fe$_{0.2}$)$_{60}$Cr$_{40}$) and a Heusler alloy layer (Co$_2$MnGe), viewed from a cut surface in the direction parallel to the film thickness. FIG. 12 includes schematic views of the images shown in FIG. 11.

The layer structure was as follows. Si substrate/Al$_2$O$_3$/base layer: Ta(30 Å)/fcc layer: (Ni$_{0.8}$Fe$_{0.2}$)$_{60}$Cr$_{40}$(60 Å)/Heusler alloy layer: (Co$_2$MnGe (100 Å)/Ta/Ta-Oxide.

In this Example, the fcc layer (NiFeCr layer) composed of (Ni$_{0.8}$Fe$_{0.2}$)$_{60}$Cr$_{40}$ had the fcc structure, in which equivalent crystal planes represented as [111] planes were preferentially oriented in the direction parallel to the layer surface. The Heusler alloy layer (Co$_2$MnGe layer) composed of Co$_2$MnGe had the bcc structure, in which equivalent crystal planes represented as [220] planes were preferentially oriented in the direction parallel to the layer surface.

Referring to FIGS. 11 and 12, a columnar crystal was formed, in which a crystal grain boundary formed in the fcc layer (NiFeCr layer), the crystal grain boundary appearing in a cut surface in the direction parallel to the thickness of the fcc layer (NiFeCr layer), and a crystal grain boundary formed in the Heusler alloy layer (Co$_2$MnGe layer) were continuous. In addition, in the columnar crystal, the crystals of the fcc layer (NiFeCr layer) were matched with the crystals of the Heusler alloy layer (Co$_2$MnGe layer) in a heteroepitaxial state.

In the Heusler alloy layer (Co$_2$MnGe layer), the average grain size (i.e., the average of in-plane grain sizes in crystal grains shown in FIGS. 11 and 12) in the direction parallel to the layer surface is preferably at least about 50 Å. In this Example, the average grain size was 200 Å.

The crystals of the fcc layer (NiFeCr layer) and the crystals of the Heusler alloy layer (Co$_2$MnGe layer) in the columnar crystal were analyzed by nanobeam electron diffractometry. FIGS. 11 and 12 include the electron diffraction patterns.

Referring to the diffraction pattern of the fcc layer (NiFeCr layer), diffraction spots showing equivalent crystal planes represented as [111] planes of the fcc structure were observed in series in the direction of the layer thickness. This pattern indicated that equivalent crystal planes represented as [111] planes were preferentially oriented in the direction parallel to the layer surface.

Referring to the diffraction pattern of the Heusler alloy layer (Co$_2$MnGe layer), diffraction spots showing equivalent crystal planes represented as [220] planes of the bcc structure were observed in series in the direction of the layer thickness. This pattern indicated that equivalent crystal planes represented as [220] planes were preferentially oriented in the direction parallel to the layer surface. These patterns also showed that the crystal axis in the fcc [111] direction of the fcc layer (NiFeCr layer) was parallel to the crystal axis in the bcc [110] direction of the Heusler alloy layer (Co$_2$MnGe layer).

A layered product using Co$_2$MnSi instead of Co$_2$MnGe used in the above Example showed the same results.

In the above Examples, the Heusler alloy layer is preferably deposited on the fcc layer such that the Heusler alloy layer is matched with the fcc layer in an epitaxial or a heteroepitaxial state. In order to achieve this, the sputtering gas pressure to sputter the elements from a target is preferably about $5\times10^{-5}$ Torr ($6.7\times10^{-3}$ Pa) to about $3\times10^{-3}$ Torr (0.4 Pa). In the above Examples, argon was used as the sputtering gas with a sputtering gas pressure of $1.5\times10^{-3}$ Torr (0.2 Pa).

Optimizing the sputtering gas pressure provides the following advantage: Atoms of the Heusler alloy layer have energy for adequately moving on an fcc layer so that after reaching the fcc layer, the atoms sputtered from the target substrate, which are the material of the Heusler alloy layer, can be rearranged according to the atomic arrangement of the fcc layer.

An excessively high sputtering gas pressure increases collision frequency between the atoms of the Heusler alloy layer and the sputtering gas molecules. Consequently, the atoms, which become the material of the Heusler alloy layer, lose their energy before reaching the fcc layer. For these reasons, the upper limit of the sputtering gas pressure was determined as described above.

The temperature of the substrate having the fcc layer thereon is preferably from about 0° C. to about 100° C. In the above Examples, the temperature of the substrate was kept at 30° C. to 40° C. by water-cooling.

Optimizing the temperature of the substrate having the fcc layer provides the following advantage: Atoms of the Heusler alloy layer sputtered on the fcc layer from the target readily move on the fcc layer and are readily rearranged according to the atomic arrangement of the fcc layer. However, an excessively high temperature of the substrate having the fcc layer is not preferable because interdiffusion of the atoms at the interface between the fcc layer and the Heusler alloy layer occurs to a significant degree. For these reasons, the upper limit of the substrate temperature was determined as described above.

The distance between the target and the substrate having the fcc layer is preferably from about 50 to about 300 mm. In the above Examples, the distance between the target and the substrate having the fcc layer was 89 mm.

The distance between the target and the substrate having the fcc layer is preferably small so as to decrease the collision frequency between the atoms of the Heusler alloy layer and the sputtering gas molecules. As a result, when reaching the fcc layer, the atoms of the Heusler alloy layer have a large amount of energy.

However, an excessively small distance between the target and the substrate having the fcc layer is not preferable. The temperature of the substrate having the fcc layer is excessively increased by secondary electrons from the target and radiation heat, and consequently, interdiffusion of the atoms at the interface between the fcc layer and the Heusler alloy layer occurs to a significant degree. Furthermore, in an excessively small distance between the target and the substrate having the fcc layer, it is difficult to deposit the Heusler alloy layer having a uniform thickness.

For these reasons, the distance between the target and the substrate having the fcc layer was determined as described above.

In the above Examples, after depositing the Heusler alloy layer, the Heusler alloy layer was annealed at 290° C. for 4 hours to form the superlattice of the Heusler alloy.

Comparative Example

Figure 13:
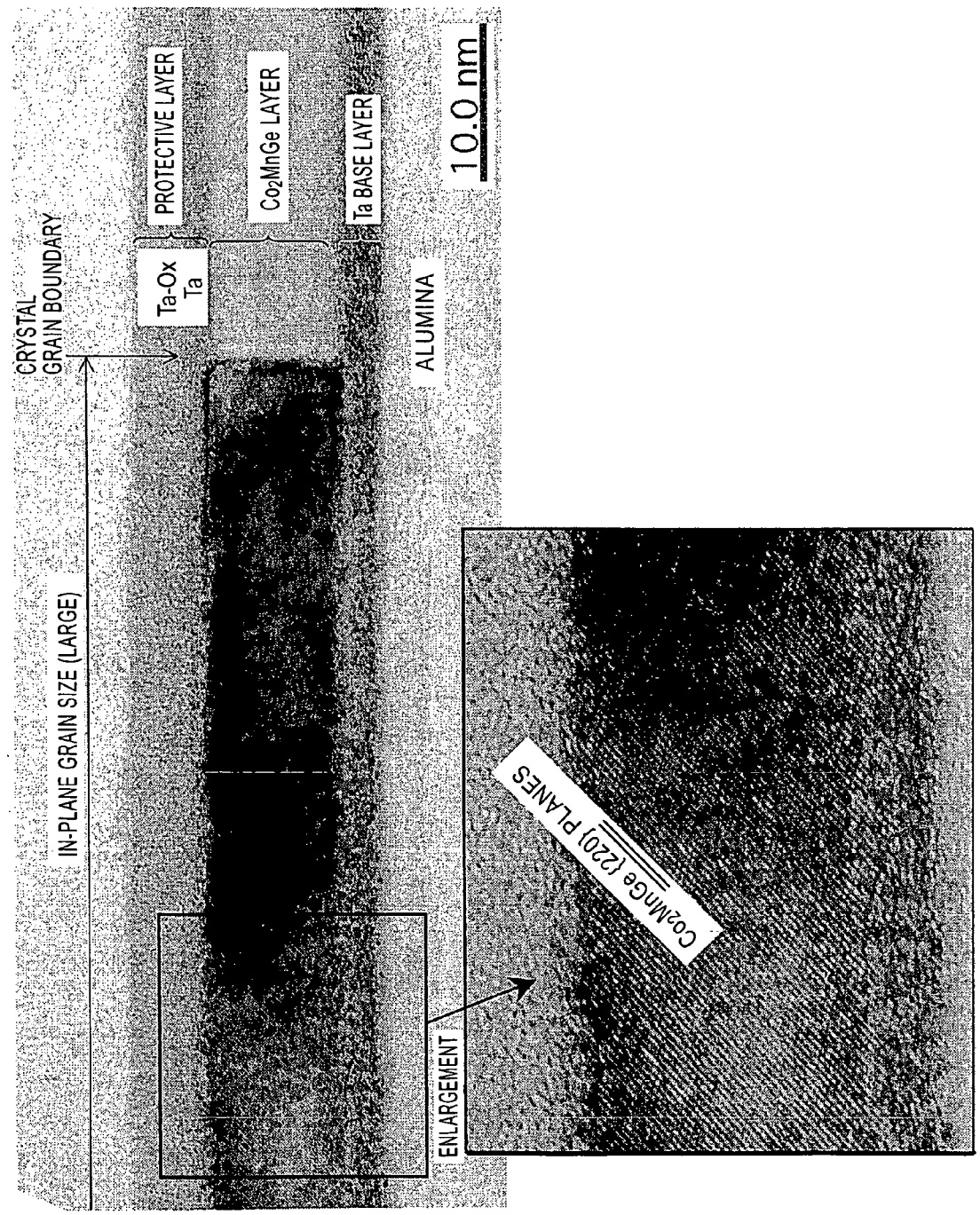
FIG. 13 shows transmission electron microscope images of a multilayer film including a Heusler alloy layer disposed on a Ta layer.
Figure 14:
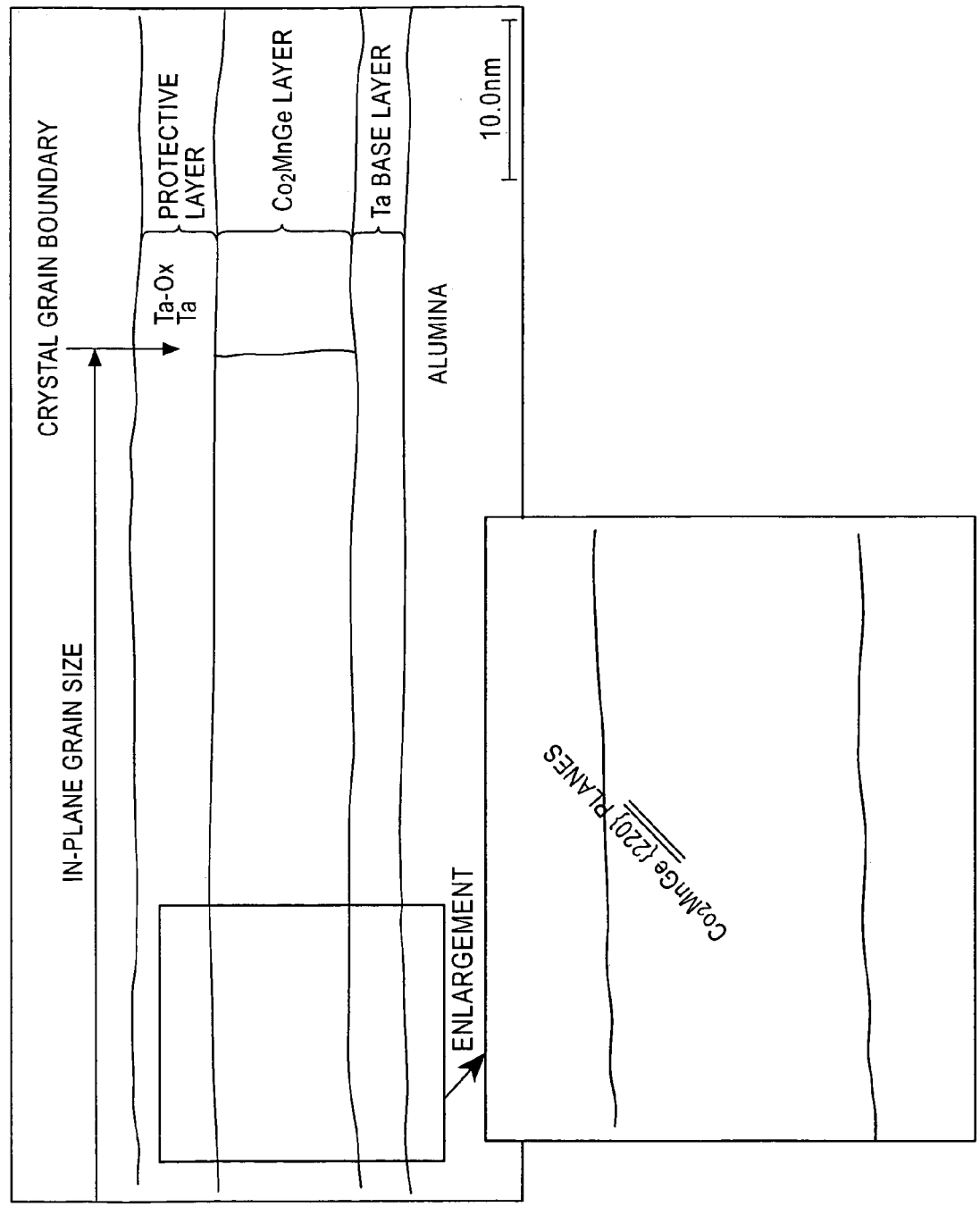
FIG. 14 shows schematic views of the images shown in FIG. 13.
Figure 15:
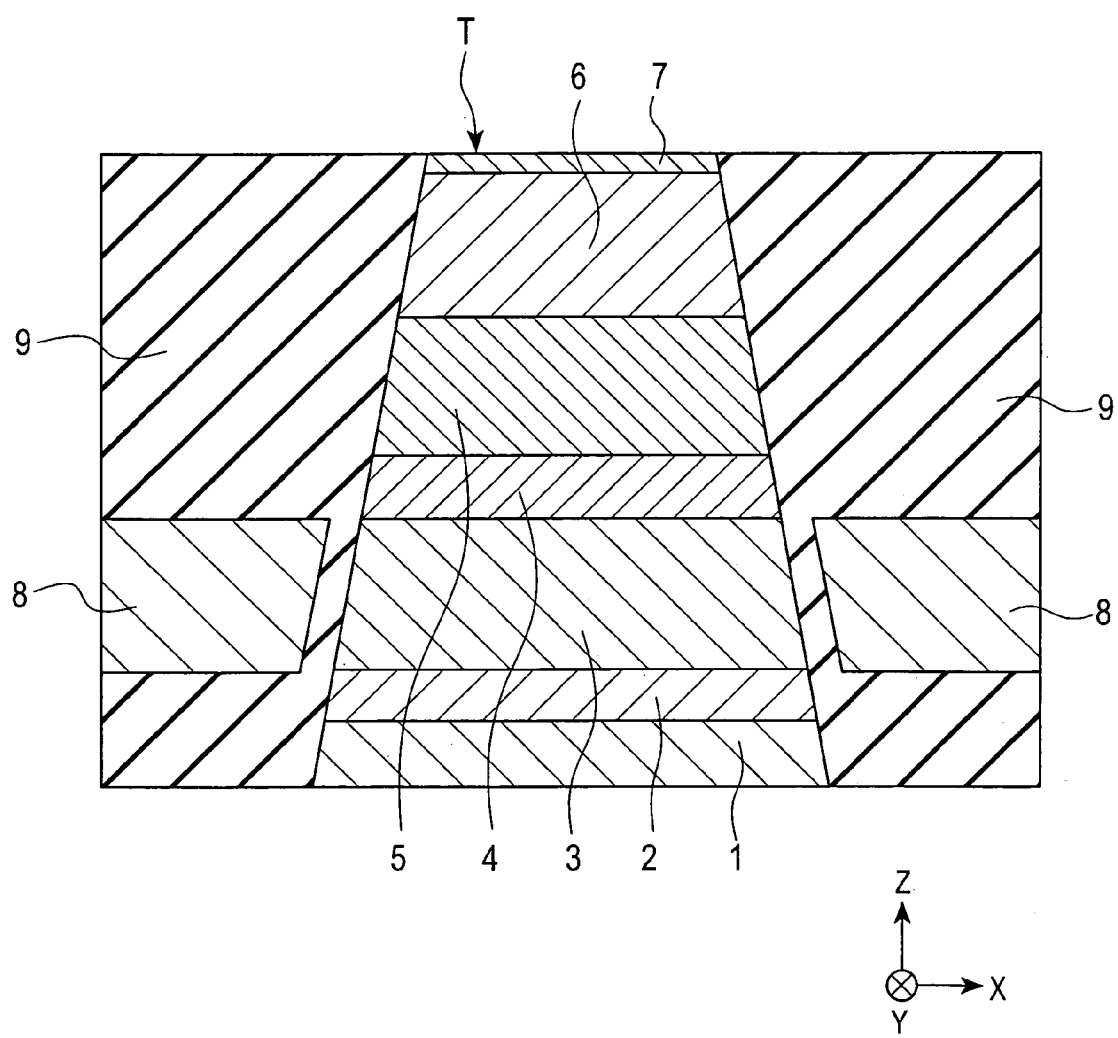
FIG. 15 is a cross-sectional view of the structure of a known magnetic sensing element, viewed from a surface facing a recording medium.

FIG. 13 includes TEM images of a layered product of a known art including a base layer composed of Ta and a Heusler alloy layer ($Co_2MnGe$), viewed from a cut surface in the direction parallel to the film thickness. FIG. 14 includes schematic views of the images shown in FIG. 13.

The layer structure was as follows. Si substrate/$Al_2O_3$/base layer: Ta (30 Å)/Heusler alloy layer: ($Co_2MnGe$(100 Å)/Ta/Ta-Oxide.

In this Comparative Example, the base layer composed of Ta had crystallites that were substantially amorphous. The Heusler alloy layer ($Co_2MnGe$ layer) had the bcc structure and had a large average grain size in the direction parallel to the layer surface. However, equivalent crystal planes represented as [220] planes were not preferentially oriented in the direction of the layer surface.

A top spin-valve magnetic sensing element was formed in which a free magnetic layer composed of a Heusler alloy ($Co_2MnGe$) was directly deposited on a base layer composed of Ta. In this magnetic sensing element, the amount of change in resistance ΔRA was about 0.14 mΩμm², and the ratio of change in resistance ΔR/Re was about 0.15%.

Although the present invention has been described with reference to preferable Examples, the present invention can be modified as long as the modifications do not deviate from the scope of the invention. For example, the magnetic sensing element of the present invention may be a current perpendicular to the plane-tunnel magnetoresistive (CPP-TMR) magnetic sensing element. The magnetic sensing element of the present invention may be a current in the plane-giant magnetoresistive (CIP-GMR) magnetic sensing element in which electrode layers are disposed at both sides of the magnetic sensing element and a sense current flows in the direction parallel to the surface of each layer of the multilayer film that forms the element.

The above Examples are intended as examples only, and do not limit an aspect of the present invention.

The invention claimed is:

1. A magnetic sensing element comprising:
   at least one pinned magnetic layer in which the magnetization direction is pinned in one direction;
   a free magnetic layer; and
   at least one nonmagnetic layer disposed between the at least one pinned magnetic layer and the free magnetic layer,
   wherein at least one of the free magnetic layer and the at least one pinned magnetic layer comprises a Heusler alloy layer, and wherein the Heusler alloy layer is disposed on a surface of an fcc layer having a face-centered cubic (fcc) structure, in which equivalent crystal planes represented as [111] planes are preferentially oriented in a direction parallel to the surface of the fcc layer; and
   wherein the Heusler alloy layer comprises a metallic compound having a Heusler crystal structure represented by a one of a composition formula $X_2YZ$ or XYZ, wherein X is at least one element selected from the group consisting of Cu, Co, Ni, Rh, Pt, Au, Pd, Ir, Ru, Ag, Zn, Cd, and Fe; Y is at least one element selected from the group consisting of Mn, Fe, Ti, V, Zr, Nb, Hf, Ta, Cr, Co, and Ni; and Z is at least one element selected from the group consisting of Al, Sn, In, Sb, Ga, Si, Ge, Pb, and Zn.

2. The magnetic sensing element according to claim 1, wherein the Heusler alloy layer has a body-centered cubic (bcc) structure, in which equivalent crystal planes represented as [220] planes are preferentially oriented in the direction parallel to the surface of the fcc layer surface.

3. The magnetic sensing element according to claim 1, wherein the fcc layer comprises the at least one nonmagnetic layer.

4. The magnetic sensing element according to claim 1, wherein the fcc layer comprises a sublayer forming on least a portion of the free magnetic layer.

5. The magnetic sensing element according to claim 1, wherein the fcc layer comprises a sublayer forming at least a part of the pinned magnetic layer.

6. The magnetic sensing element according to claim 1, wherein the fcc layer comprises a seed layer disposed under the free magnetic layer.

7. The magnetic sensing element according to claim 1, wherein an average grain size of the Heusler alloy layer in the direction parallel to the layer surface is at least about 50 Å.

8. The magnetic sensing element according to claim 1, wherein a columnar crystal is formed in the Heusler layer, in which a crystal grain boundary formed in the fcc layer, a crystal grain boundary appearing in a cut surface in the direction parallel to the thickness of the fcc layer, and a crystal grain boundary formed in the Heusler alloy layer are continuous.

9. The magnetic sensing element according to claim 8, wherein crystals of the fcc layer in the columnar crystal are matched with crystals of the Heusler alloy layer in a heteroepitaxial state.

10. The magnetic sensing element according to claim 1, wherein the free magnetic layer comprises first and second free magnetic layers, when the first free magnetic layer comprises NiFe and the second free magnetic layer comprises CoFe.

11. The magnetic sensing element according to claim 1, wherein the Heusler alloy layer comprises a metallic compound represented by a composition formula $X_2MnZ$, wherein X is at least one element selected from the group consisting of Cu, Co, Ni, Au, and Pd; and Z is at least one element selected from the group consisting of Al, Sn, In, Sb, Ga, Si, and Ge.

12. The magnetic sensing element according to claim 11, wherein the Heusler alloy layer comprises a metallic compound represented by a composition formula $Co_2MnZ$, wherein Z is at least one element selected from the group consisting of Al, Sb, Si, and Ge.

13. The magnetic sensing element according to claim 1, further comprising:

at least one antiferromagnetic layer,
wherein the at least one pinned magnetic layer is formed in contact with the at least one antiferromagnetic layer, and the magnetization direction of the at least one pinned magnetic layer is pinned by the exchange anisotropic magnetic field with the at least one antiferromagnetic layer.

14. The magnetic sensing element according to claim 1, wherein the at least one nonmagnetic layer comprises first and second nonmagnetic layers, wherein the at least one pinned magnetic layer comprises first and second pinned magnetic layers, and wherein the first nonmagnetic layer is disposed on the free magnetic layer, and the second nonmagnetic layer is disposed under the free magnetic layer, and wherein the first pinned magnetic layer is disposed on the first nonmagnetic layer, and the second pinned magnetic layer is disposed under the second nonmagnetic layer.

15. The magnetic sensing element according to claim 14, further comprising:

a first antiferromagnetic layer disposed on the first pinned magnetic layer; and a second antiferromagnetic layer disposed under the second pinned magnetic layer, wherein the first and second antiferromagnetic layers pin the magnetization direction of the first and second layers, respectively, pinned magnetic layers, in one direction by the exchange anisotropic magnetic field.

16. The magnetic sensing element according to claim 1, wherein a sense current flows in the direction perpendicular to a surface of the at least one pinned magnetic layer, the at least one nonmagnetic layer, and the free magnetic layer.

* * * * *

UNITED STATES PATENT AND TRADEMARK OFFICE
CERTIFICATE OF CORRECTION

| | | |
|---|---|---|
| PATENT NO. | : 7,310,207 B2 | Page 1 of 1 |
| APPLICATION NO. | : 10/953930 | |
| DATED | : December 18, 2007 | |
| INVENTOR(S) | : Naoya Hasegawa et al. | |

It is certified that error appears in the above-identified patent and that said Letters Patent is hereby corrected as shown below:

<u>In the Claims</u>

Column 28, in claim 4, line 2, after "a sublayer forming" delete "on least" and substitute --at least-- in its place.

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,310,207 B2 | Page 1 of 1 |
| APPLICATION NO. | : 10/953930 | |
| DATED | : December 18, 2007 | |
| INVENTOR(S) | : Naoya Hasegawa et al. | |

It is certified that error appears in the above-identified patent and that said Letters Patent is hereby corrected as shown below:

<u>In the Claims</u>

Column 28, in claim 4, line 38, after "a sublayer forming" delete "on least" and substitute --at least-- in its place.

This certificate supersedes the Certificate of Correction issued June 3, 2008.

Signed and Sealed this

First Day of July, 2008

JON W. DUDAS
*Director of the United States Patent and Trademark Office*